US009923337B2

(12) United States Patent
Yoshinaga et al.

(10) Patent No.: US 9,923,337 B2

(45) Date of Patent: Mar. 20, 2018

(54) QUANTUM CASCADE LASER

(71) Applicant: SUMITOMO ELECTRIC INDUSTRIES, LTD., Osaka (JP)

(72) Inventors: Hiroyuki Yoshinaga, Yokohama (JP); Tsukuru Katsuyama, Yokohama (JP); Jun-ichi Hashimoto, Yokohama (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 15/352,159

(22) Filed: Nov. 15, 2016

(65) Prior Publication Data

US 2017/0141542 A1 May 18, 2017

(30) Foreign Application Priority Data

Nov. 16, 2015 (JP) ................................ 2015-224086

(51) Int. Cl.

*H01S 5/34* (2006.01)
*H01S 5/042* (2006.01)
*H01S 5/026* (2006.01)

(52) U.S. Cl.

CPC ............ *H01S 5/3401* (2013.01); *H01S 5/026* (2013.01); *H01S 5/0425* (2013.01)

(58) Field of Classification Search

CPC ....... H01S 5/3401; H01S 5/026; H01S 5/0425
See application file for complete search history.

(56) References Cited

U.S. PATENT DOCUMENTS 5,294,815 A 3/1994 Iechi
5,544,269 A 8/1996 Hattori
5,550,391 A 8/1996 Yamaguchi
5,627,851 A 5/1997 Takahashi
6,034,982 A * 3/2000 Iwase .................... H01S 5/4031 372/38.1

(Continued)

FOREIGN PATENT DOCUMENTS

JP 2010-514163 4/2010
WO 2014/085562 6/2014

OTHER PUBLICATIONS

Office Action for U.S. Appl. No. 15/222,765 dated Jan. 13, 2017.
Office Action for U.S. Appl. No. 15/222,765 dated Jul. 5, 2017.

*Primary Examiner* — Xinning Niu

(74) *Attorney, Agent, or Firm* — Smith, Gambrell & Russell, LLP

(57) ABSTRACT

A quantum cascade laser includes a laser structure including laser waveguide structures and a first terrace region; first electrodes; pad electrodes; and wiring metal conductors. The laser structure includes first, second and third regions arranged in a direction of a first axis. The third region is disposed between the first and second regions. The first region has a first end facet disposed at a boundary between the first and third regions. The first end facet extends in a direction intersecting with the first axis. The second region has a second end facet disposed at a boundary between the second and third regions. The second region includes the laser structure. The pad electrodes are disposed on the first terrace region. The first electrodes are disposed on the laser waveguide structures. Each of the pad electrodes is connected to one of the first electrodes through one of the wiring metal conductors.

8 Claims, 16 Drawing Sheets

(56) References Cited

U.S. PATENT DOCUMENTS

| | | | | |
|---|---|---|---|---|
| 6,043,104 | A * | 3/2000 | Uchida .................. | B82Y 20/00 257/94 |
| 2002/0018501 | A1 | 2/2002 | Hatakoshi et al. | |
| 2007/0001578 | A1 | 1/2007 | Iki et al. | |
| 2008/0144677 | A1 * | 6/2008 | Belkin .................. | B82Y 20/00 372/20 |

* cited by examiner

CROSS-SECTION TAKEN ALONG III-III LINE

CROSS-SECTION TAKEN ALONG IV-IV LINE

CROSS-SECTION TAKEN ALONG V-V LINE

CROSS-SECTION TAKEN ALONG VI-VI LINE

QUANTUM CASCADE LASER

BACKGROUND OF THE INVENTION

Field of the Invention

The present invention relates to a quantum cascade laser.

Related Background Art

Unexamined Patent Publication No. 2010-514163, referred to as Patent publication 1, discloses a quantum cascade laser. This application claims the benefit of priority from Japanese Patent Application No. 2015-224086 filed on Nov. 16, 2015, which is herein incorporated by reference in its entirety.

SUMMARY OF THE INVENTION

A quantum cascade laser according to one aspect of the present invention includes: a substrate including a first substrate region, a second substrate region, and a third substrate region that are arranged in a direction of a first axis, the third substrate region being disposed between the first substrate region and the second substrate region; a laser structure disposed on the substrate, the laser structure including a plurality of laser waveguide structures each extending in the direction of the first axis, and a first terrace region disposed on the first substrate region, the laser structure including a first region, a second region and a third region that include the first substrate region, the second substrate region, and the third substrate region of the substrate, respectively, the first region having a first end facet disposed at a boundary between the first region and the third region, the first end facet extending in a direction intersecting with the first axis, the second region having a second end facet disposed at a boundary between the second region and the third region, the second end facet extending in a direction intersecting with the first axis, the second region including the laser waveguide structures; a plurality of first electrodes disposed on the laser waveguide structures, each of the laser waveguide structures having a core layer extending in the direction of the first axis, the core layer terminating at the second end facet; a plurality of wiring metal conductors; and a plurality of pad electrodes disposed on the first terrace region, each of the pad electrodes being connected to one of the first electrodes through one of the wiring metal conductors.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

DETAILED DESCRIPTION

Figure 1:
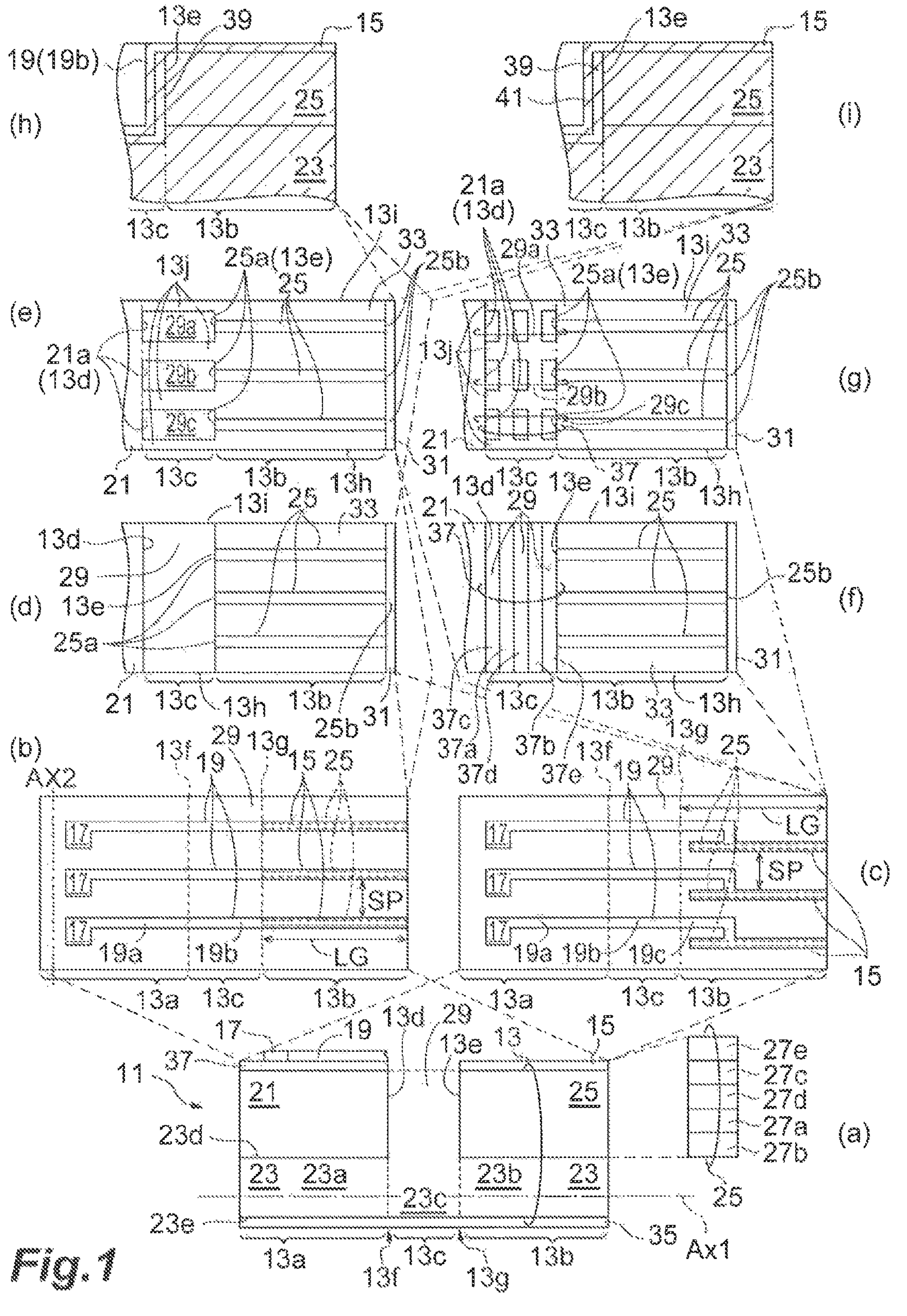
FIG. 1 is a schematic view showing exemplary structures applied to a quantum cascade laser device according to the present embodiment.

The quantum cascade laser is a candidate for light sources in the art, such as, environmental gas analysis, medical diagnosis, and industrial processing, which use light in a mid-infrared light region. Patent Document 1 discloses an array of quantum cascade lasers of single mode operation. The array of quantum cascade lasers includes a plurality of laser waveguide structures for the respective quantum cascade lasers, a plurality of electrodes connected to the respective laser waveguide structures, and a plurality of pad electrodes connected to the respective electrodes. The chip size of the quantum cascade laser array is associated with the spacing between the laser waveguide structures and the length of cavities thereof, and the length relates to the characteristics of the quantum cascade lasers. The pad electrodes require an area allowing the mounting of all the pad electrodes, and each have a size enabling their function.

A quantum cascade laser array includes an array of units each including a single quantum cascade laser and a pad electrode for the single laser waveguide structure. The structure of the array is associated with the arrangement of the units in terms of the arrangement of the pad electrodes and the laser waveguide structures in the array, so that arranging the units restricts flexibility in the arrangement of laser waveguide structures and the size of the waveguide structures in the array.

Specific embodiments according to the present above aspects are described below.

A quantum cascade laser according to an embodiment includes (a) a substrate including a first substrate region, a second substrate region, and a third substrate region that are arranged in a direction of a first axis, the third substrate region being disposed between the first substrate region and the second substrate region; (b) a laser structure disposed on the substrate, the laser structure including a plurality of laser waveguide structures each extending in the direction of the first axis, and a first terrace region disposed on the first substrate region, the laser structure including a first region, a second region and a third region that include the first substrate region, the second substrate region, and the third substrate region of the substrate, respectively, the first region having a first end facet disposed at a boundary between the first region and the third region, the first end facet extending in a direction intersecting with the first axis, the second region having a second end facet disposed at a boundary between the second region and the third region, the second end facet extending in a direction intersecting with the first axis, the second region including the laser waveguide structures; (c) a plurality of first electrodes disposed on the laser waveguide structures, each of the laser waveguide structures having a core layer extending in the direction of the first axis, and the core layer terminating at the second end facet; (d) a plurality of wiring metal conductors; and (e) a plurality of pad electrodes disposed on the first terrace region, each of the pad electrodes being connected to one of the first electrodes through one of the wiring metal conductors.

In the quantum cascade laser, the second region includes a core layer which terminates at the second end facet positioned at the boundary between the second and third regions of the laser structure. The first electrodes are disposed on the second region containing respective laser waveguide structures ended by the second end facet, and the pad electrodes are disposed on the first terrace region in the first region separated from the third region by the first end facet. The first region, the third region and the second region of the laser structure are arranged in order in the direction of the first axis. The size of the second region of the laser structure is dependent upon the interval between the adjacent laser waveguide structures, the lengths of the cavities of the laser waveguide structures, and the arrangement of the first electrodes, but the interval between the adjacent laser waveguide structures and the lengths of the cavities of the laser waveguide structures are independent of the arrangement of the pad electrodes. The arrangement of the pad electrodes is independent of the interval between the adjacent laser waveguide structures, the lengths of the cavities of the laser waveguide structures, and the arrangement of the first electrodes. Each of the pad electrodes are connected with one of the first electrodes through one of the wiring metal conductors extending across the third region of the lase structure.

In the quantum cascade laser according to an embodiment, the laser structure may further include a second terrace region disposed on the second substrate region. The second terrace region may include the second end facet and the laser waveguide structures. The first electrodes may be disposed on the second terrace region.

The quantum cascade laser allows the third region, which is defined by the first end facet and the second end facet, to separate the second terrace region from the first terrace region.

In the quantum cascade laser according to an embodiment, preferably, each of the wiring metal conductors includes a first portion disposed on the first terrace region, a second portion disposed on the third region, and a third portion disposed on the second region.

In the quantum cascade laser, the wiring metal conductor has a first portion, a second portion and a third portion. Each of the pad electrodes is connected to one of the first electrodes through one of the wiring metal conductors.

In the quantum cascade laser according to an embodiment, the third region may include an extension region extending from the first terrace region to the third substrate region in the direction of the first axis.

In the quantum cascade laser, the extension region extends in the direction of the first axis across the boundary between the first region and the third region, and has the similar laminated structure as the second terrace region. Providing the extension region may make an etching rate high in forming the second end facet, and the extension improves the mechanical strength of the quantum cascade laser device.

In the quantum cascade laser according to an embodiment, the first end facet and the second end facet may extend from a side of the quantum cascade laser to another side of the quantum cascade laser.

In the quantum cascade laser, the first end facet and the second end facet extend from the side of the quantum cascade laser device to the other side to provide the third region of the laser structure with a groove which extends from the side to the other side.

In the quantum cascade laser according to an embodiment, preferably, the core layer has a core end facet that is included in the the second end facet disposed at the boundary between the second region and the third region. Each of the wiring metal conductors is apart from the core end facet of the core layer in the second end facet.

In the quantum cascade laser, the wiring metal conductor is separated apart from the core end facet of the core layer on the second end facet, and this separation prevents the wiring metal conductor from interfering with entering and emitting of light associated with the core end facet of the core layer. The light emitted from the end facet of each laser structure may be used as monitoring light for monitoring the lasing state in each laser waveguide structure of the quantum cascade laser device.

In the quantum cascade laser according to an embodiment, preferably, the core layer has a core end facet that is included in the the second end facet disposed at the boundary between the second region and the third region. Each of the wring metal conductors has a part disposed on the core end facet of the core layer.

In the quantum cascade laser, the wiring metal conductor has a portion provided on the core end facet of the core layer, and the portion of the wiring metal conductor on the second end facet acts as a high-reflective film and allows the optical cavity of the laser waveguide structure to have a high reflectivity.

In the quantum cascade laser according to an embodiment, preferably, the core layer has a core end facet that is included in the second end facet disposed at the boundary between the second region and the third region. The quantum cascade laser may further include a metal layer disposed on the core end facet of the core layer. The metal layer may be apart from each of the wring metal conductors on the second end facet.

In the quantum cascade laser, the wiring metal conductor is spaced from the metal layer on the second end facet, and the metal layer is provided on the core end facet of the core layer. The metal layer acts as a high-reflective film and allows the optical cavity of the laser waveguide structure to have a high reflectivity.

In the quantum cascade laser according to an embodiment, preferably, the laser structure includes a distributed Bragg reflecting region disposed on the third substrate region. The second end facet is optically coupled to the distributed Bragg reflecting region. The distributed Bragg reflecting region includes one or more high reflective walls extending in a direction normal to a principal surface of the substrate. The high reflective walls are apart from the first end facet and the second end facet. In addition, the high reflective walls are disposed between the first end facet and the second end facet.

In the quantum cascade laser, the distributed Bragg reflector region acts as a mirror of the optical cavity for the laser waveguide structure.

The teachings of the present invention can be readily understood by considering the following detailed description with reference to the accompanying drawings shown as examples. Referring to the accompanying drawings, embodiments of a quantum cascade laser device according to the aspects of the present invention will be illustrated below. When possible, the same portions will be denoted by the same reference numerals. Incidentally, the following embodiments illustrate quantum cascade laser devices, each having a distributed feedback structure and a diffraction grating layer for wavelength selection, operable in a single mode.

FIG. 1 is a schematic view showing a quantum cascade laser device 11 according to the present embodiment. Part (a) of FIG. 1 shows a cross section, taken along the direction of the first axis Ax1, showing a region including the laser waveguide structure, the first electrode, the pad electrode and the wiring metal conductor in the quantum cascade laser device 11 according to the present embodiment, and parts (b) and (c) of FIG. 1 each show a plan view of the arrangement of the laser waveguide structure and the semiconductor structure in the quantum cascade laser device 11 according to the present embodiment. Parts (d), (e), (f), and (g) of FIG. 1 each show a plan view of the laser waveguide structure and the semiconductor structure in the quantum cascade laser device 11 according to the present embodiment.

The quantum cascade laser device 11 includes a semiconductor laser array comprising quantum cascade lasers, which includes a laser structure 13, first electrodes 15, pad electrodes 17 and wiring metal conductors 19. The laser structure 13 includes a first terrace region 21, a substrate 23 and laser waveguide structures 25. The substrate 23 may include a conductive semiconductor in the present embodiment. Each of the laser waveguide structures 25 includes a laser waveguide extending in the direction of the first axis Ax1. The first electrodes 15 are provided for the respective laser waveguide structures 25; the pad electrodes 17 are provided for the respective laser waveguide structures 25; and the wiring metal conductors 19 are provided for the respective laser waveguide structures 25. The laser structure 13 includes a first region 13*a*, a second region 13*b* and the third region 13*c*, and the first region 13*a*, the second region 13*b* and a third region 13*c* are arranged in the direction of the first axis Ax1. The third region 13*c* is disposed between the first region 13*a* and the second region 13*b*. The pad electrodes 17 are disposed on the first region 13*a*, and the first electrodes 15 are disposed on the second region 13*b*. The second region 13*b* includes laser waveguide structures 25, and the first electrodes 15 are in contact with the respective upper surfaces of the laser waveguide structures 25. Each of the pad electrodes 17 is connected to one of the first electrodes 15 through one of the wiring metal conductors 19. The wiring metal conductors 19 extend from one of the first region 13*a* and the second region 13*b* to the other to cross the third region 13*c*.

The wiring metal conductors 19 may have one of structures as shown in parts (b) and (c) of FIG. 1. Part (b) of FIG. 1 shows a configuration of direct connection, and each of the wiring metal conductors 19 includes a first portion 19*a* extending on the first region 13*a*, and a second portion 19*b* extending on the third region 13*c*. An end of the second portion 19*b* may be connected to the first portion 19*a*, and the other end of the second portion 19*b* may be connected directly to an end of the first electrode 15 at the upper edge of the second end facet 13*e*.

Alternatively, part (c) of FIG. 1 shows a configuration of bypass connection, and each of the wiring metal conductors 19 may include a first portion 19*a* extending on the first region 13*a*, a second portion 19*b* extending on the third region 13*c*, and a third portion 19*c* extending on the second region 13*b*. The end of the second portion 19*b* is connected to the first portion 19*a*, and the other end of the second portion 19*b* is connected to one end of the third portion 19*c* for bypassing. The other end of the third portion 19*c* may be connected to an intermediate portion between the end and the other end of the first electrode 15.

The first region 13*a* has a first end facet 13*d*, and extends in the direction of a second axis Ax2 intersecting with the direction of the first axis Ax1. The second region 13*b* has a second end facet 13*e*, and extends in the direction of the second axis Ax2. The first end facet 13*d* is located at the first boundary 13*f* between the first region 13*a* and the third region 13*c*, and the second end facet 13*e* is located at the second boundary 13*g* between the second region 13*b* and the third region 13*c*. The first end facet 13*d* and the second end facet 13*e* reach the substrate 23 in depth.

The substrate 23 includes a first substrate region 23*a*, a second substrate region 23*b*, and a third substrate region 23*c*, and the first substrate region 23*a*, the second substrate region 23*b* and the third substrate region 23*c* are arranged in the direction of the first axis Ax1. The first region 13*a*, the second region 13*b* and the third region 13*c* of the laser structure 13 includes a first substrate region 23*a*, a second substrate region 23*b* and a third substrate region 23*c*, respectively. The substrate 23 includes a principal surface 23*d* and a back surface 23*e*. The first terrace region 21 and the laser waveguide structures 25 are disposed on the principal surface 23*d*, and the second electrode 35 is disposed on the back surface 23*e* so as to be shared with the laser waveguide structures 25.

The pad electrodes 17 are arranged on the first terrace region 21, and the first terrace region 21 is disposed on the first substrate region 23*a*. The first electrodes 15 are provided on the respective laser waveguide structures 25. Each of the laser waveguide structures 25 includes a core layer 27*a* extending in the direction of the first axis Ax1, and the core layer 27*a* (in the laser waveguide structure 25) terminates at the second end facet 13*e*. Each laser waveguide structure 25 includes a lower cladding layer 27*b* and an upper cladding layer 27*c*, and the core layer 27*a* is disposed between the lower cladding layer 27*b* and the upper cladding layer 27*c*. The laser waveguide structure 25 includes a diffraction grating layer 27*d* and a contact layer 27*e*, and the diffraction grating layer 27*d* is disposed between the core layer 27*a* and the upper cladding layer 27*c*, and the contact layer 27*e* is located at the top of the laser waveguide structure 25. The laser waveguide structure 25 including the core layer 27*a* functions as a quantum cascade laser which may emit light with a wavelength in a mid-infrared wavelength region, for example, the range of about 3 to 20 micrometers, and the quantum cascade laser device 11 has an arrayed light source which is integrated with the quantum cascade lasers. In the preferred embodiment, the quantum cascade lasers (the laser waveguide structures 25) constituting the array structure in the quantum cascade laser device 11 generate respective light beams each having a different wavelength determined by the period, Λ, of the different diffraction grating, which is contained in the diffraction grating layer 27*d*.

The laser structure 13 has one or more recess portions 29, which are provided so as to form the first end facet 13*d* and the second end facet 13*e* in the third region 13*c*. The third region 13*c* may have one of the structures as described below. The recess portions 29, the first end facet 13*d* and the second end facet 13*e* are formed by removing the semiconductor layer on the third substrate region 23*c* by dry etching. The processing by dry etching may form the end facets 13*d* and 13*e* with high verticality, and the high verticality may provide the end facet 13*e* with a reflectivity as high as that of an end facet formed by cleavage. Forming an end facet by dry etching may leave surface roughness (roughness ranging from 50 to 100 nm), which, if any, is negligibly small as compared to lasing wavelengths of light, which the quantum cascade laser emits, in a long infrared wavelength region, for example, 3 micrometers or more. Such small roughness, which may be a cause of irregular reflection, hardly degrade the actual reflectivity of the end facet 13*e*. This shows that the end facet 13*e* formed by etching is unlikely to cause the deterioration of the lasing characteristics of the quantum cascade lasers.

(First Structure)

As shown in part (d) of FIG. 1, in the third region 13, the laser structure 13 has a single recess portion 29, which is provided by a groove extending from the side 13*h* to the other side 13*i*. The first end facet 13*d* and the second end facet 13*e* extend from the side 13*h* of the laser structure 13 (quantum cascade laser device 11) to the other side 13*i* to form the above-mentioned groove (the single recess portion 29). The laser structure 13 further include a second terrace region 33 disposed on the second substrate region 23*b*. The second terrace region 33 includes laser waveguide structures 25 and the second end facet 13*e*, and each laser waveguide structure 25 includes a core layer 27*a*, a lower cladding layer 27*b*, an upper cladding layer 27*c*, a diffraction grating layer 27*d*, and a contact layer 27*e*. Each laser waveguide structure 25 mounts the first electrode 15 thereon, which is not shown in part (d) of FIG. 1 for simplicity. The second end facet 13*e* includes the end facet 25*a* of the laser waveguide structure 25. The second terrace region 33 also includes the end facet 25*a* of the laser waveguide structure 25, and the other end facet 25*b* opposite to the end facet 25*a* (the second end facet 13*e*). Each of the laser waveguide structures 25 may include an optical cavity having the end facet 25*a* (the second end facet 13*e*) and the other end facet 25*b* (and if any, a reflective structure 31 adjacent to the other end facet 25*b*). The wiring arrangement of one of parts (b) and (c) of FIG. 1 may be applied to the first structure. Specifically, the second portion 19*b* of the wiring metal conductor 19 extends on both sides and bottom of the recess portion 29 (the first end facet 13*d*, the second end facet 13*e* and the principal surface 23*d* of the substrate 23).

(Second Structure)

As shown in part (e) of FIG. 1, in the third region 13*c*, the laser structure 13 includes the recess portions 29, which are constituted by openings 29*a*, 29*b*, and 29*c* for the respective laser waveguide structures 25. Each of the openings 29*a*, 29*b*, and 29*c* is formed by the end facet 25*a* of the first terrace region 21 and the terrace end facet 21*a* of the laser waveguide structure 25. Each laser waveguide structure 25 may include an optical cavity having the end facet 25*a* (the second end facet 13*e*), and the other end facet 25*b* (and if any, a reflective structure 31 adjacent to the other end facet 25*b*). The laser structure 13 further include the second terrace region 33 disposed on the second substrate region 23*b*. The second terrace region 33 includes the laser waveguide structures 25 and the second end facet 13*e*. Each laser waveguide structure 25 in the second terrace region 33 mounts the first electrode 15 thereon, which is not shown in part (e) of FIG. 1 for simplicity. The second terrace region 33 is separated from the first terrace region 21 by the third region 13*c*, which is defined by the first end facet 13*d* and the second end facet 13*e*. The third region 13*c* includes one or more extension regions 13*j* extending from the second terrace region 33 on the third substrate region 23*c* along the direction of the first axis Ax1. Each extension region 13*j* extends in the direction of the first axis Ax1 across the second boundary 13*g* between the second region 13*b* and the third region 13*c*. The extension region 13*j* has the same laminated structure as the second terrace region 33. The extension regions 13*j* extend from the second terrace region 33 in the second region 13*b* and reach the first terrace region 21, thereby defining openings 29*a*, 29*b*, and 29*c*. Each laser waveguide structure 25 may include an optical cavity having the end facet 25*a* (the second end facet 13*e*), and the other end facet 25*b* (and if any, a reflective structure 31 adjacent to the other end facet 25*b*). The wiring arrangement of one of parts (b) and (c) FIG. 1 may be applied to the second structure. Specifically, in the wiring arrangement shown in part (c) of FIG. 1, the second portion 19*b* of the wiring metal conductor 19 extends on the extension regions 13*j*. The first terrace region 21, the second terrace region 33 and the extension region 13*j* have substantially the same thickness in the direction normal to the principal surface 23*d* of the substrate 23, so that the wiring metal conductor 19 may connect the first electrode 15 to the pad electrode 17 without passing a large difference in level.

(Third Structure)

As shown in part (f) of FIG. 1, in the third region 13*c*, the laser structure 13 includes the recess portions 29, which are constituted by grooves extending from the side 13*h* to the other side 13*i*. The recess portions 29 define semiconductor walls, each protruding from the principal surface 23*d* of the substrate 23 in the direction normal thereto in the third region 13*c*, and the semiconductor walls define respective high refractive index portions 37*a* and 37*b* of a distributed reflection region 37. The recesses 29 may be filled with respective low refractive index portions 37*c* made of, for example, dielectric material of a lower refractive index than the semiconductor walls 37*d* and 37*e*. Hence, the distributed reflection region 37 includes the low refractive index portions and the high refractive index portions which are arranged alternately. Each laser waveguide structure 25 may include an optical cavity for the distributed reflector region 37 and the other end facet 25*b* (and if any, the reflective structure 31 adjacent to the other end facet 25*b*). The wiring arrangement shown in part (c) of FIG. 1 may be applied to the third structure. Specifically, in the wiring arrangement shown in part (c) of FIG. 1, the second portion 19*b* of the wiring metal conductor 19 extends on the arrangement of the high refractive index portions 37*a* and 37*b* of the semiconductor walls, and the low refractive index portions 37*c*, 37*d*, and 37*e* of dielectric material. As described above, the low refractive index portions are embedded by, for example, a dielectric material to reduce a difference in level between the high refractive index portions and the low refractive index portions, so that the distributed reflection region 37 has the same thickness as the first terrace region 21 and the second terrace region 33 in the direction normal to the principal surface 23*d* of the substrate 23, allowing the wiring metal body 19 to connect the pad electrode 17 to the first electrode 15 without passing a large difference in level.

(Fourth Structure)

As shown in part (g) of FIG. 1, in the third region 13*c*, the laser structure 13 includes openings 29*a*, openings 29*b*, and openings 29*c* for the respective laser waveguide structures 25. The openings 29*a*, 29*b*, and 29*c* are defined by the terrace end facets 21*a* of the first terrace regions 21 and the end facets 25*a* of the laser waveguide structures 25. The distributed reflection regions 37 for the optical cavity are disposed in the respective opening 29*a*, 29*b*, and 29*c*. As already described, each of the distributed reflection regions 37 includes high refractive index portions 37*a* and 37*b*, each made of a semiconductor wall, which protrudes in the direction normal to the principal surface 23*d* of the substrate 23 in the third region 13*c*. Each recess portion 29 is filled with a dielectric material of a smaller refractive index than the semiconductor walls, thereby providing the distributed reflection region 37 with the low refractive index portions 37*c*, 37*d* and 37*e*. Hence, the distributed reflection region 37 includes low refractive index portions and high refractive index portions which are arranged alternately. Each laser waveguide structure 25 may include an optical cavity having the distributed reflector region 37 and the other end facet 25*b* (and, if any, a reflective structure 31 adjacent to the other end facet 25*b*). The wiring arrangement shown in part (c) FIG. 1 may be applied to the fourth structure. Specifically, the second portions 19*b* of the wiring metal conductors 19 extend on the respective extension regions 13*j*. The first terrace region 21, the second terrace region 33 and the extension regions 13*j* have substantially the same thickness in the direction normal to the principal surface 23*d* of the substrate 23, allowing the wiring metal conductors 19 to connect the pad electrodes 17 to the first electrodes 15 without climbing a large difference in level.

The second end facet 13*e* is optically coupled to the distributed reflection regions 37 on the third substrate region 23*c* in the third structure and the fourth structure. The distributed reflection regions 37 include one or more high refractive index walls each made of a semiconductor, and protruding in the direction normal to the principal surface 23*d* of the substrate 23. The high refractive index walls are disposed between the first end facet 13*d* and the second end facet 13*e*, and each high refractive index wall is spaced from the first end facet 13*d* and the second end facet 13*e*, so that the distributed reflector regions 37 act as an optical cavity mirror for the laser waveguide structure 25. In the present embodiment, the high refractive index portions 37*a* and 37*b* of each distributed reflection region 37 are periodically arranged so as to enable Bragg reflection. The low refractive index portions 37*c*, 37*d* and 37*e*, made of material having a refractive index lower than the high refractive index portions 37*a* and 37*b* (walls of a lower refractive index material than that of each of the high refractive index portions 37*a* and 38*b*), are disposed between the adjacent high refractive index portions 37*a* and 37*b*, between the high refractive index portion 37*a* and the first end facet 13*d*, and between the high refractive index portion 37*b* and the second end facet 13*e*, respectively. Specifically, the high refractive index portions 37*a* and 37*b* each include a semiconductor wall. The two high refractive index portions 37*a* and 37*b*, the low refractive index portion 37*d* therebetween, and the low refractive index portion 37*e* between the second end facet 13*e* and the second end facet 13*e* have respective thicknesses in the Ax1 direction, the arrangement of which are determined to form a periodic array enabling Bragg reflection in a desired wavelength band. For example, in order to enable high Bragg reflection of the distributed reflector region 37 most effectively, the high refractive index portions 37*a* and 37*b*, the low refractive index portion 37*d* between the high refractive index portions 37*a* and 37*b*, and the low refractive index portion 37*e* between the high refractive index portion 37*b* and the second end facet 13*e* have respective thicknesses, which may be equal to odd-number times of the reference width $\lambda/(4\times n)$ in the longitudinal direction of the laser waveguide structure 25 (the Ax1 direction) desirably, (where "λ" indicates the lasing wavelength of the quantum cascade laser in vacuum, and "n" indicates an effective refractive index of the high refractive index portion or the low refractive index portion at the lasing wavelength). Specifically, the thicknesses of the high refractive index portions 37*a* and 37*b*, the low refractive index portion 37*d* between the high refractive index portions 37*a* and 37*b*, and the low refractive index portion 37*e* between the high refractive index portion 37*b* and the second end facet 13*e* may be $\lambda/(4\times n)$ or $3\times\lambda/(4\times n)$. Such high and low refractive index portions allow the distribution reflection region 37 to function as a high-reflection film increasing the reflectivity of the lasing mirror located at the rear end facet of the laser waveguide structure 25, and contribute to improvement in characteristics of the quantum cascade laser device 11, such as reduction in the threshold value, and increase in optical power. The number of the high refractive index portions in the distributed reflector region 37 may be an optional natural number, and a larger natural number enables a higher reflection. Spaces between the high refractive index portion 37*a* and 37*b*, between the high refractive index portion 37*a* and the first end facet 13*d*, and between the high refractive index portion 37*b* and the second end facet 13*e* may be filled with material of low refractive index to reduce a difference in level in the diffraction grating, allowing the wiring metal conductor 19 to connect the first electrode 15 to the pad electrode 17 without crossing a large difference in level.

In the first to fourth structures, the reflective structure 31 may include a distributed reflector region having the same structure as the distributed reflection region 37, or a coating made of a metal or a dielectric material.

In these quantum cascade laser devices 11, the second region 13*b* of the laser structure 13 includes the core layer 27*a* which terminates at the second end facet 13*e* positioned on the second boundary 13*g* between the second region 13*b* and the third region 13*c*. The laser waveguide structures 25 and the first electrodes 15 are disposed on the second region 13*b*, which is separated by the second end facet 13*e*, whereas the pad electrodes 17 are disposed on the first terrace region 21 of the first region 13*a*, which is separated from the third region 13*c* by the first end facet 13*d*. The first region 13*a*, the third region 13*c* and the second region 13*b* of the laser structure 13 are arranged in order in the direction of the first axis Ax1, so that the size of the second region 13*b* in the laser structure 13 depends on the interval SP between the laser waveguide structures 25 adjacent thereto, the cavity length LG of each laser waveguide structure 25, and the arrangement of the first electrodes 15, whereas the interval SP, and the cavity length LG may be determined independently of the arrangement and size of the pad electrodes 17. The arrangement of the pad electrodes 17 may be determined independently of the interval SP, the cavity length LG, and the arrangement of the first electrodes 15 on the first region 13*a* of the laser structure 13. The first electrodes 15 and the pad electrodes 17 are connected to each other by the respective wiring metal conductors 19 extending across the third region 13*c* of the laser structure 13.

Parts (h) and (i) of FIG. 1 are cross-sectional views, taken along the longitudinal direction (the direction of the first axis Ax1) of the quantum cascade laser device 11 according to the first structure and the second structure, each showing a configuration of the wiring metal conductors 19 extending on the third region 13*c*.

Referring to part (h) of FIG. 1, the insulating film 39 is disposed to cover the second end facet 13*e* and the third region 13*c*. The second portion 19*b* of the wiring metal conductor 19 extends on the insulating film 39 on the core end facet of the core layer 27*a*, included in the second end facet 13*e*, and reaches the end of the first electrode 15, as shown in part (b) of FIG. 1. The second portion 19*b* constitutes a part of the optical cavity of the laser waveguide structure 25, and acts as a high-reflective film increasing the reflectivity of the optical cavity mirror, located at the second end facet 13*e*, for the laser waveguide structure 25, thereby contributing to improvement in characteristics of the quantum cascade laser device 11, such as, reduction in threshold current and increase in optical output. Further, as described above, in the present structure, the wiring metal conductor 19 on the rear end facet of the laser waveguide structure 25 also serves as a high reflection film, and the high reflection film on the rear end facet may be formed together with an upper electrode including the first electrodes 15, the pad electrodes 17 and the wiring metal conductors 19 on the wafer in the manufacturing process. This process is simplified as compared to conventional process in which the high reflective film on the rear end facet is formed separately from the formation of the upper electrode. The second portion 19*b* effectively functions as a high-reflective film, and may have a larger width than that of the core layer 27*a* (in the laser waveguide structure 25) in the direction of the second axis Ax2, allowing the wider second portion 19*b* to reflect almost all light from the laser waveguide structure 25.

Referring to part (i) of FIG. 1, the insulating film 39 is disposed to cover the second end facet 13*e* and the third region 13*c*, and the metal layer 41 extends on the insulating film 39 on the core end facet, included in the second end facet 13*e*, of the core layer 27*a* and reaches the end of the first electrode 15. The metal layer 41 terminates in the third region 13*c*, and is not provided in the first region 13*a*. The second portion 19*b* of the wiring metal conductor 19 extends on the insulating film 39 covering the second end facet 13*e* so as to circumvent the core end facet of the core layer 27*a* and be apart from the core end facet of the core layer 27*a*, and is connected to the third portion (the third portion 19*c* in part (c) of FIG. 1) that extends on the top of the second terrace region 33. As shown in part (c) of FIG. 1, the third portion 19*c* is connected to the first electrode 15 on the top of the second terrace region 33. The metal layer 41 constitutes a part of the optical cavity of the laser waveguide structure 25, and may function as a high-reflective film which can increase the reflectivity of the optical cavity mirror in the laser waveguide structure 25 at the second end facet 13*e*. Further, the metal layer 41 acting as the high reflective film on the rear end facet may be formed on the wafer in the manufacturing process together with an upper electrode including the first electrode 15, the pad electrode 17 and the wiring metal conductor 19. This process is simplified, similar to the structure as shown in part (h) of FIG. 1, as compared to the process for fabricating a conventional array structure.

If necessary, the metal layer 41 may not be disposed on the insulating film 39 covering on the end facet of the core layer 27*a*. The second portion 19*b* of the wiring metal conductor 19 extends apart from the core end facet of the core layer 27*a* on the insulating film 39 covering the second end facet 13*e* to circumvent the core end facet of the core layer 27*a*, and is connected to the third portion extending (the third portion 19*c* shown in part (c) of FIG. 1) on the top of the second terrace region 33. As shown in part (c) of FIG. 1, the third portion 19*c* is connected to the first electrode 15 on the top of the second terrace region 33. The second portion 19*b* of the wiring metal conductor 19 is apart from the core end facet of the core layer 27*a* on the second end facet 13*e* not to interfere with entrance and/or emission of light associated with the core end facet of the core layer 27*a*. This structure allows light from the second end facet 13*e* of each laser waveguide structure 25 to serve as an optical beam for monitoring the lasing state of each laser waveguide structure 25 in the quantum cascade laser.

Exemplary structures are described below.

Example 1

Figure 2A:
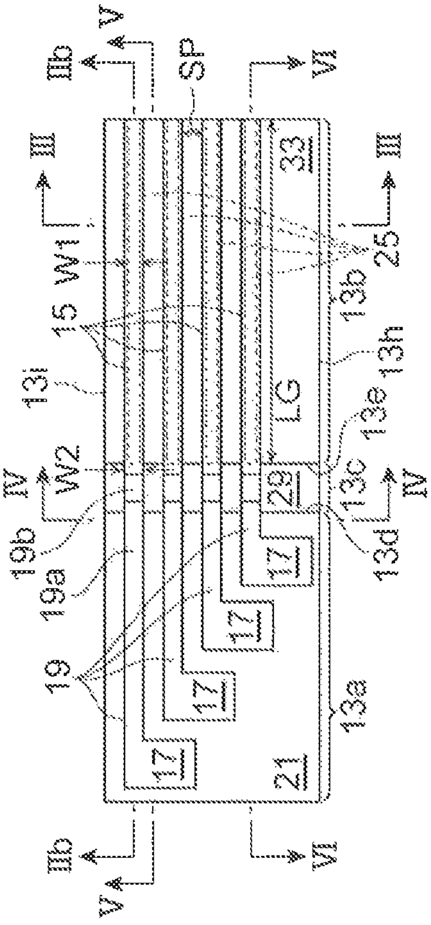
FIGS. 2A and 2B are schematic views each showing a quantum cascade laser device according to Example 1.
Figure 2B:
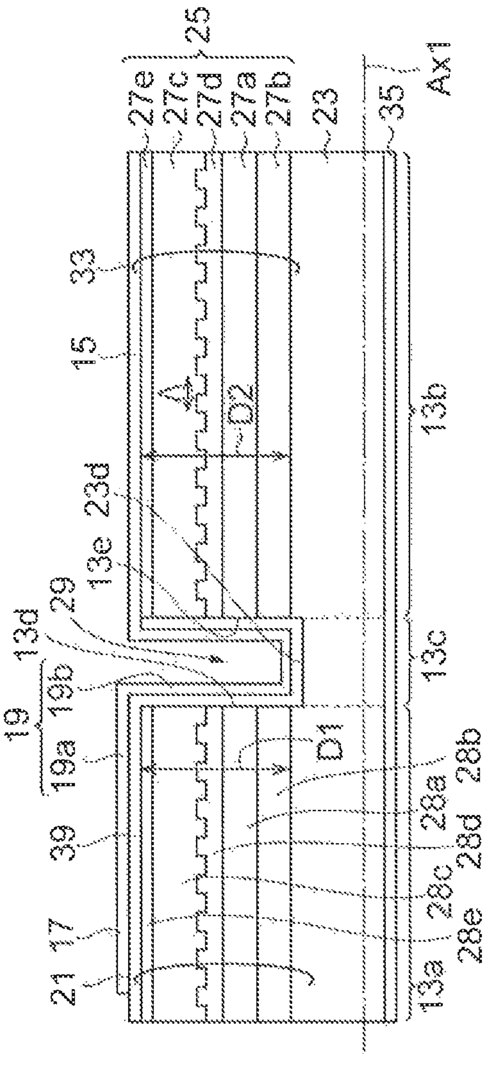

FIGS. 2A and 2B are schematic views each showing a quantum cascade laser device 11 according to Example 1. Specifically, FIG. 2A is a plan view showing a quantum cascade laser device 11 according to Example 1, and FIG. 2B is a cross sectional view taken along the line IIb-IIb in FIG. 2A. The quantum cascade laser device 11 according to Example 1 includes a distributed feedback structure. The second portion 19*b* of the wiring metal conductor 19 extends on the core end facet of the core layer 27*a* on the second end facet 13*e* to serve as a high reflective film, which increases the reflectivity of the optical cavity mirror in the laser waveguide structure 25 at the second end facet 13*e*. Moreover, the wiring metal conductor 19 also serves as a high reflective film for the rear end facet of the laser waveguide structure 25, and in the manufacturing process applied to the wafer, the high reflective film at the end facet may be formed together with an upper electrode comprising the first electrode 15, the wiring metal conductor 19, and the pad electrodes 17. Further, in the mid-infrared quantum cascade lasers, the first width W1, which is defined as the width of the core layer 27*a* (in the waveguide structure 25) in the direction of the second axis Ax2, may be equal to or lower than about 10 micrometers in order to obtain a single mode operation in the horizontal transverse mode of lasing light in the direction of the second axis Ax2. In order to allow the second portion 19*b* to work as a high reflective film which may reflect most of light propagating in the laser waveguide structure 25, the width W2 of the second portion 19*b* in the direction of the second axis Ax2 may be greater than or equal to the first width W1 on the second end facet 13*e*, and may be, for example, 20 micrometers or more. In Example 1, the first terrace region 21 may include a first semiconductor layer 28*a*, a second semiconductor layer 28*b*, a third semiconductor layer 28*c*, and a fourth semiconductor layer 28*d* and a fifth semiconductor layer 28*e*, and the first semiconductor layer 28*a*, the second semiconductor layer 28*b*, the third semiconductor layer 28*c*, the fourth semiconductor layer 28*d* and the fifth semiconductor layer 28*e* include respective semiconductor layers which are substantially the same as the core layer 27*a*, the lower cladding layer 27*b*, the upper cladding layer 27*c*, the diffraction grating layer 27*d* and the contact layer 27*e*. This laminated structure allows the first terrace region 21 to have a first thickness D1 substantially the same as the second thickness D2 of the second terrace region 33, so that the first terrace region 21 has substantially the same height as the second terrace region 33 in the direction normal to the principal surface 23*d* of the substrate. The third region 13*c* comprises a single recess portion 29, and the recess portion 29 may include a single groove defined by the first end facet 13*d* and the second end facet 13*e*. The single groove extends from the side 13*h* of the laser structure 13 to the other side 13*i*. In the structure according to the present embodiment, in forming the rear end facet of the laser waveguide structure 25, the recess portion 29 is formed by selectively etching in a process dedicated to this etching, thereby forming a rear end facet of the laser waveguide structure 25 with high productivity for a short time.

Figure 3:
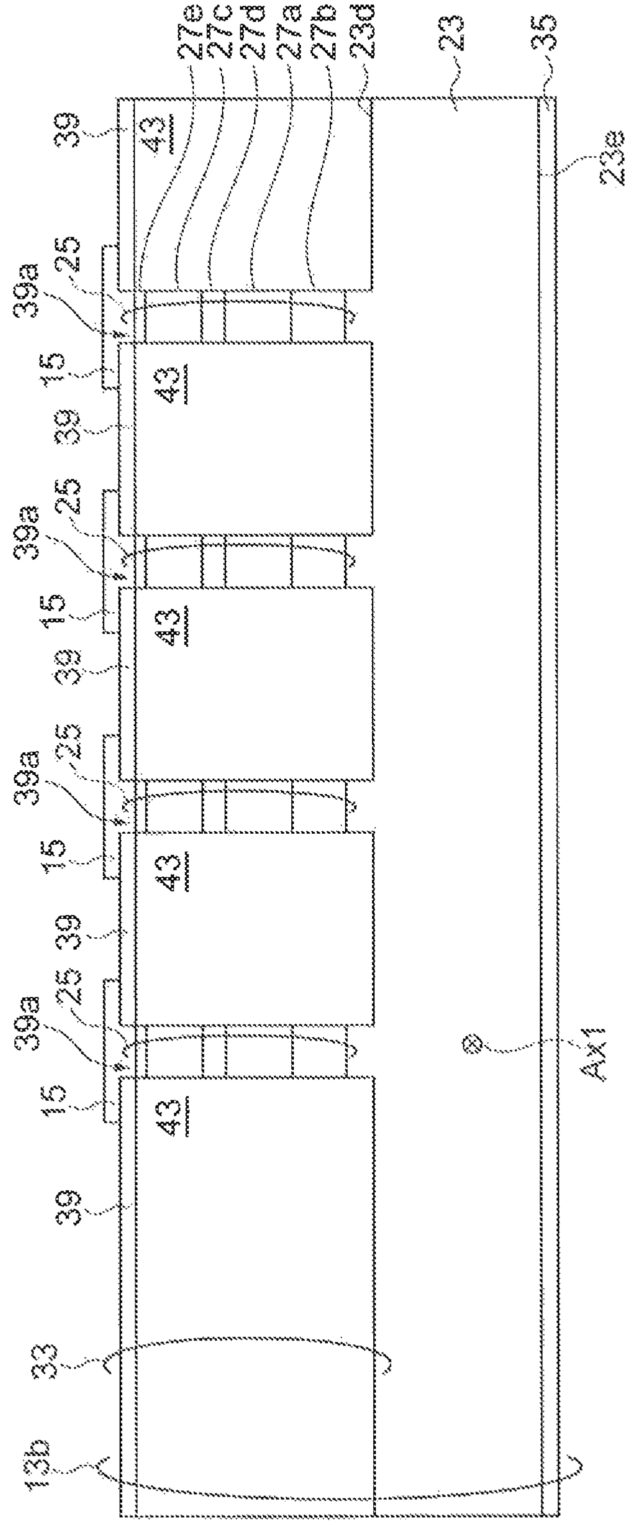
FIG. 3 is a cross sectional view taken along the line III-III shown in FIG. 2A.

Further, referring to FIG. 2B, the diffraction grating layer 27*d* in the laser waveguide structure is provided with a diffraction grating having recesses and projections arranged alternately at a period portion. A single longitudinal mode oscillation occurs at a Bragg wavelength corresponding to the period Λ. The laser waveguide structures 25 may have different values for period Λ such that the laser waveguide structures 25 may operate at different oscillation wavelengths. Such a quantum cascade laser device 11 may operate as a light source of a wide wavelength band containing a number of lasing wavelengths FIG. 3 is a cross sectional view taken along the line III-III shown in FIG. 2A. The laser structure 13 may have a buried heterostructure in which the laser waveguide structures 25 formed by etching into a mesa shape is buried by a burying region 43. The burying region 43 includes, for example, an undoped semiconductor or semi-insulating semiconductor. The burying region 43 buries the mesa sides of the laser waveguide structure 25 to insulate the laser waveguide structures 25 from each other. The insulating film 39 has an opening 39*a* on the top of each laser waveguide structure 25, and the first electrode 15 is in contact with the top of the laser waveguide structure 25 through the opening 39*a*. The second electrode 35 forms an electrical contact with the back surface 23*e* of the substrate 23.

Figure 4:
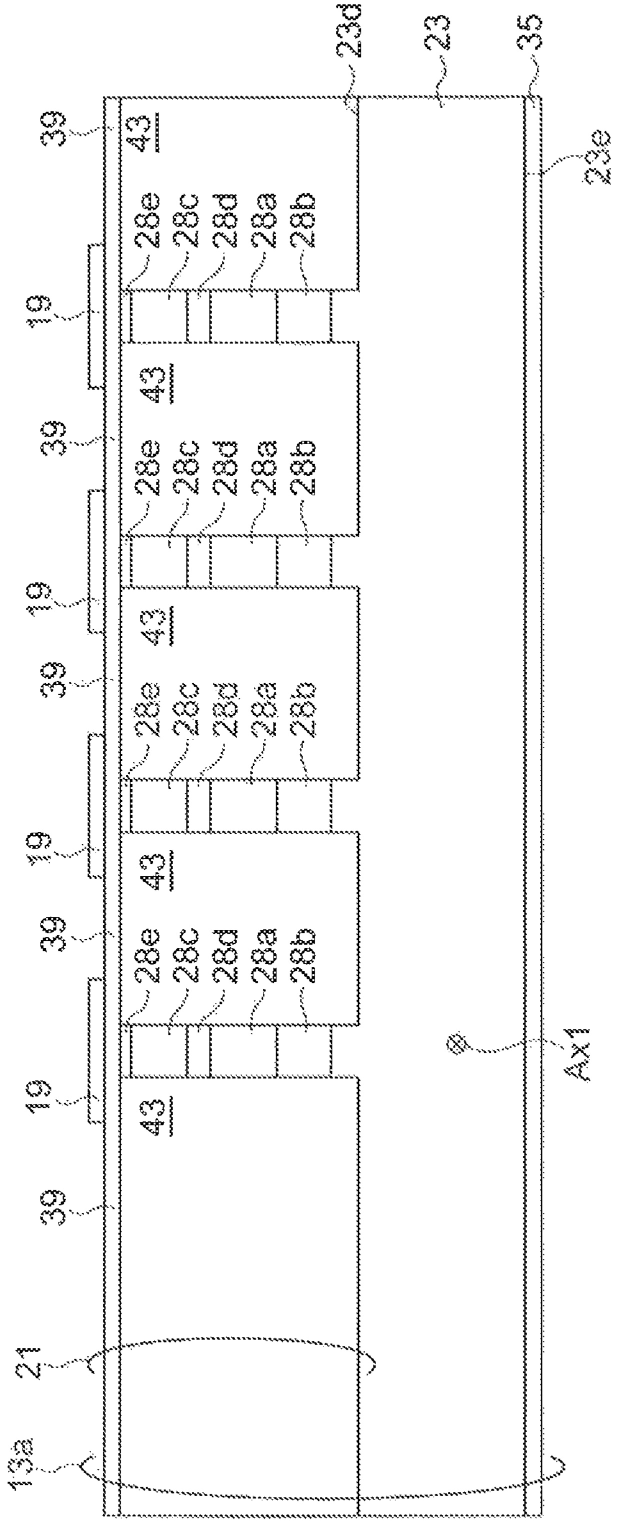
FIG. 4 is a cross sectional view taken along the line IV-IV shown in FIG. 2A.

FIG. 4 is a cross sectional view taken along the line IV-IV shown in FIG. 2A. The first terrace region 21 mounts four pad electrodes 17, as shown in FIG. 2B, and these pad electrodes 17 are connected to the respective wiring metal conductors 19 (19*a*). In the first region 13*a*, the surfaces of the fifth semiconductor layer 28*e* and the burying region 43 are covered with an insulating film 39, and the insulating film 39 insulates the pad electrodes 17 and the wiring metal conductors 19 from the underlying semiconductor. The second electrode 35 forms an electrical contact with the back surface 23*e* of the substrate 23.

Figure 5:
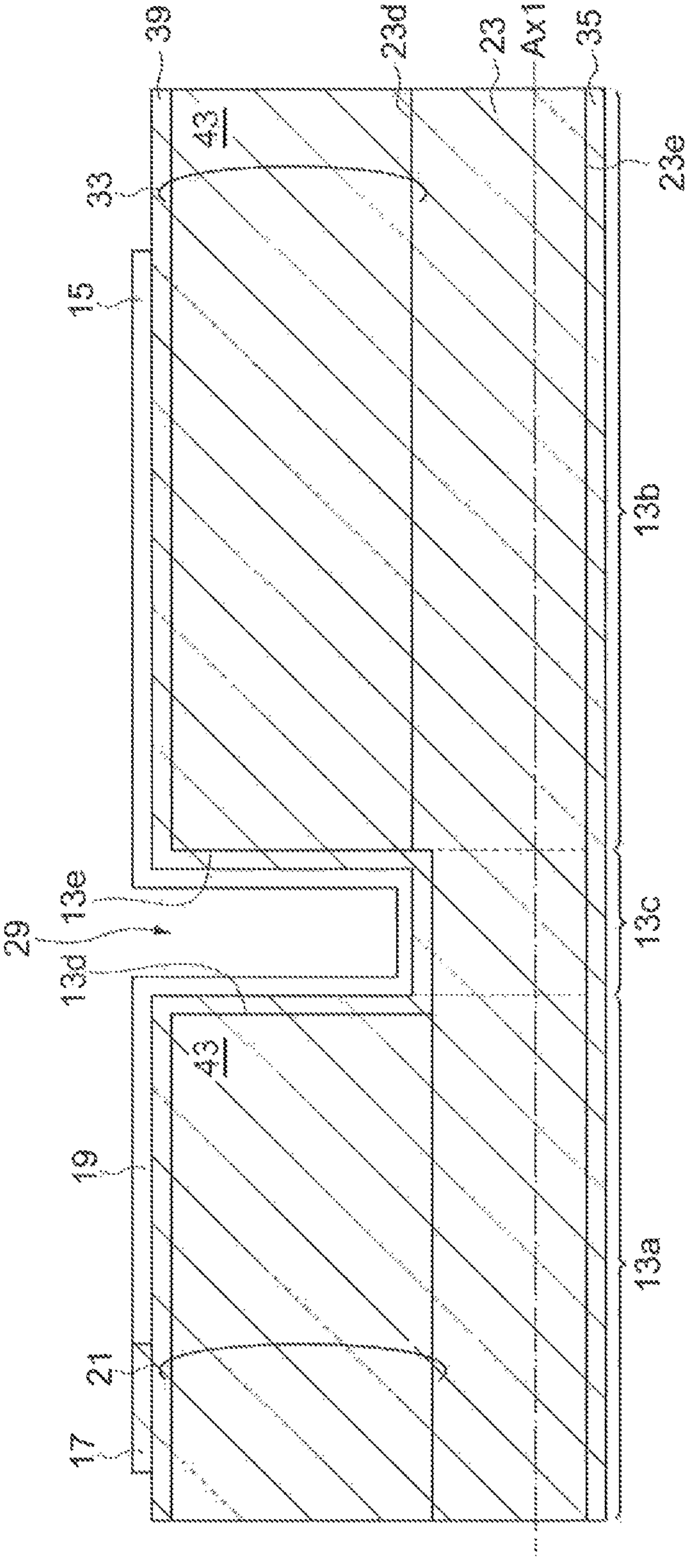
FIG. 5 is a cross sectional view taken along the line V-V shown in FIG. 2A.

FIG. 5 is a cross sectional view taken along the line V-V shown in FIG. 2A. The burying region 43 reaches the first end facet 13*d* and the second end facet 13*e*. In the laser structure 13, the insulating film 39 covers the first terrace region 21, the surface of the burying region 43 of the second terrace region 33, the first end facet 13*d*, the second end facet 13*e*, and the principal surface 23*d* of the substrate 23 in the third region 13*c*. The first electrodes 15, the wiring metal conductors 19 and the pad electrodes 17 extend on the insulating film 39. The insulating film 39 insulates the first electrodes 15, the pad electrodes 17 and the wiring metal conductors 19 from the substrate 23, the first end facet 13*d*, the second end facet 13*e* and the burying region 43. The second electrode 35 forms an electrical contact with the back surface 23*e* of the substrate 23.

Figure 6:
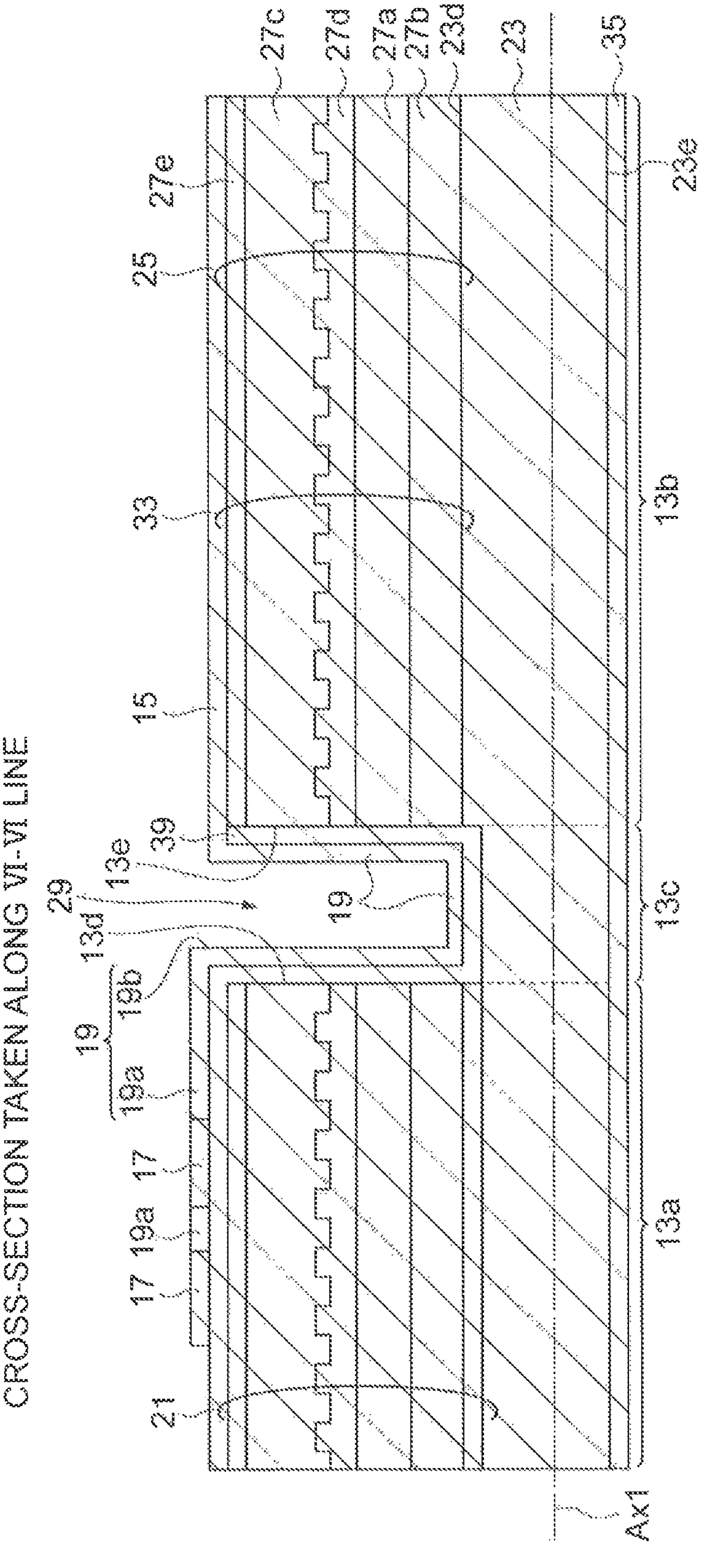
FIG. 6 is a cross sectional view taken along the line VI-VI shown in FIG. 2A.

FIG. 6 is a cross sectional view taken along the line VI-VI shown in FIG. 2A. As shown in FIGS. 6 and 2A, the pad electrodes 17 are arranged corresponding to the laser waveguide structures 25 in the direction of the first axis Ax1, and the arrangement contributes to reduction in the semiconductor chip size for the quantum cascade laser device 11.

Example 2

Figure 7A:
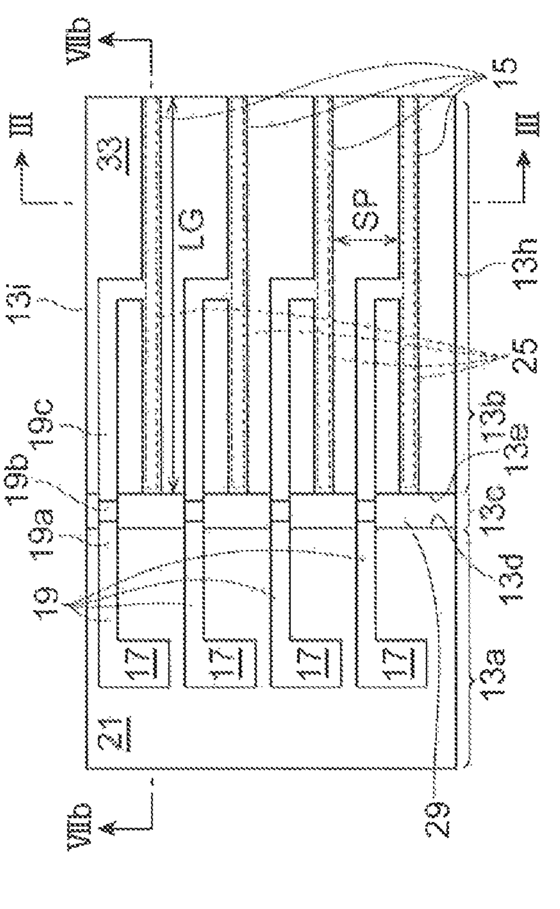
FIGS. 7A and 7B are schematic views each illustrating a quantum cascade laser device according to Example 2.
Figure 7B:
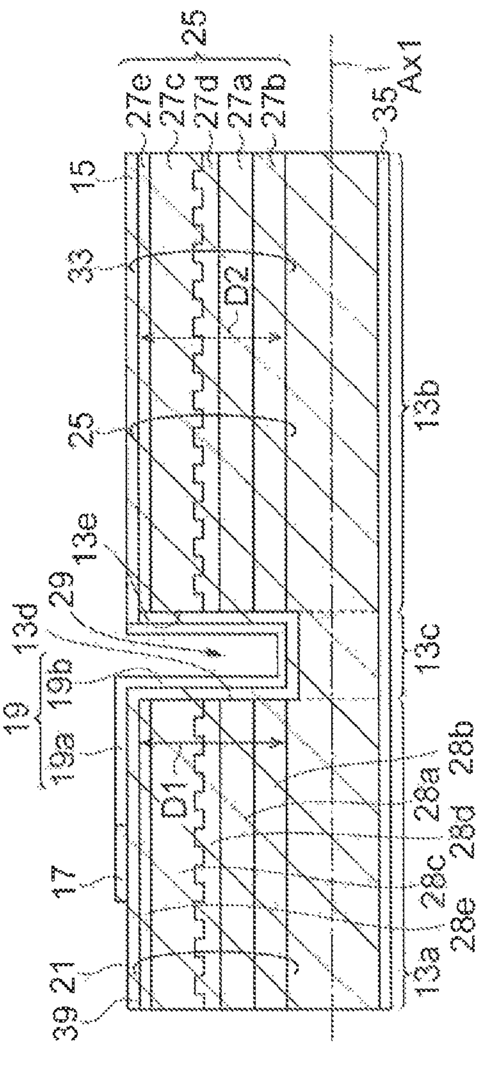

FIGS. 7A and 7B are schematic diagrams each illustrating a quantum cascade laser device 11 according to Example 2. FIG. 7A is a plan view showing a quantum cascade laser device 11 according to Example 2, and FIG. 7B is a cross sectional view taken along VIIb-VIIb line shown in FIG. 7A. The quantum cascade laser device 11 according to Example 2 has a distributed feedback structure. Example 2 differs from Example 1 in terms of the shape of the wiring metal conductor 19, and otherwise is the same as Example 1. The second portion 19*b* of the wiring metal conductor 19 extends on an area of the second end facet 13*e* apart from the core end facet of the core layer 27*a* included in the second end facet 13*e*. Any metal body including the second portion 19*b* is not provided on the core end facet of the core layer 27*a*. Preferably, the second portion 19*b* is apart from the laser waveguide structure 25 on the second end facet 13*e*, in particular by a distance of not less than 5 micrometers from the side of the semiconductor mesa of the laser waveguide structure 25, to prevent the second portion 19*b* from affecting light reflection at the second end facet 13*e* of the laser waveguide structure 25. In the structure according to the present embodiment, the second portion 19*b* disposed apart from the core end facet of the core layer 27*a* does not interfere with the optical incidence and/or emission associated with the core end facet of the core layer 27*a*. In the arrangement of the second portion 19*b* and the core end facet of the core layer 27*a*, light emitted from the second end facet 13*e* of each waveguide structure 25 may be used to monitor the lasing state of the quantum cascade laser in the waveguide structure 25. In Example 2, the first thickness D1 of the first terrace region 21 is also substantially the same as the second thickness D2 of the second terrace region 33. The third region 13*c* comprises a single recess portion 29, which is a single groove defined by the first end facet 13*d* and the second end facet 13*e*. This groove extends from the side 13*h* of the laser structure 13 to the other side 13*i* and reaches the substrate 23 in depth. The wiring metal conductor 19 extends in the recess portion 29 so as not to cover the core end facet of the core layer 27*a*.

Example 3

Figure 8A:
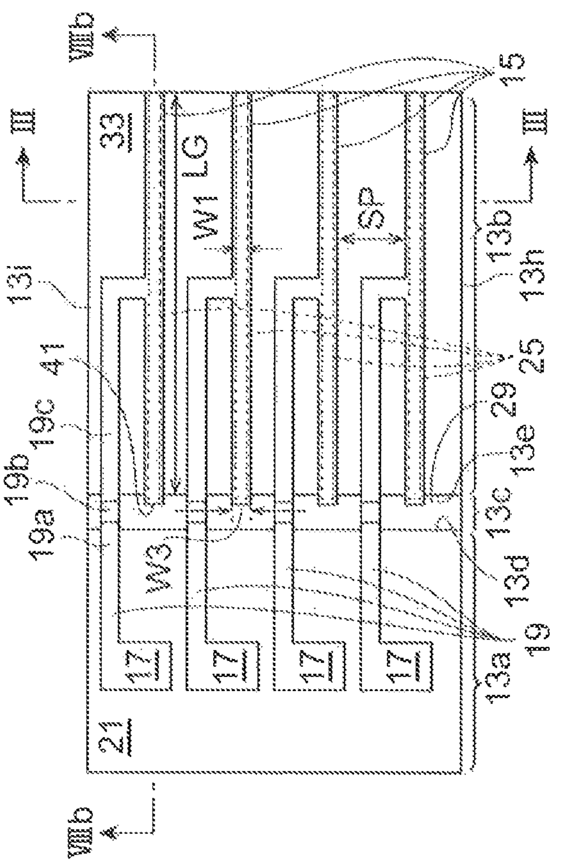
FIGS. 8A and 8B are schematic views each showing a quantum cascade laser device according to Example 3.
Figure 8B:
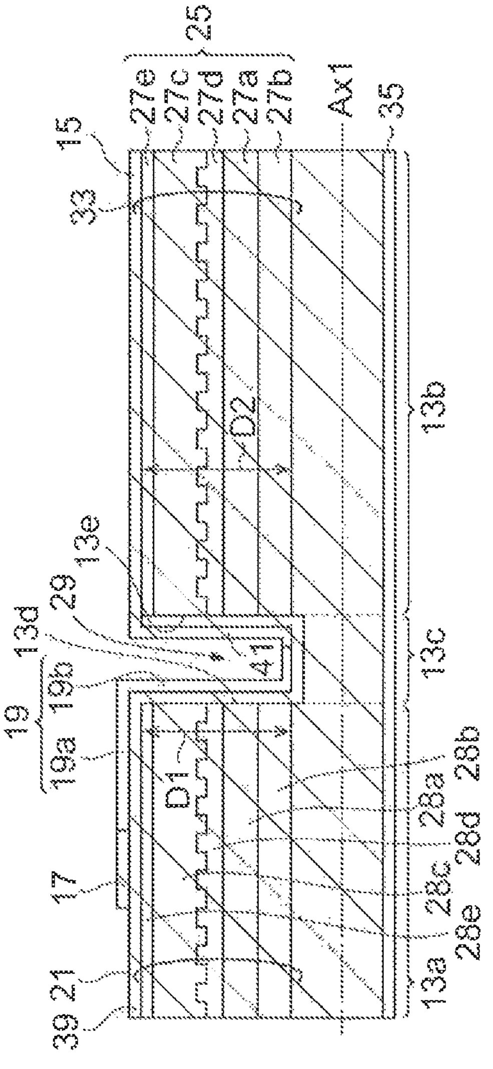

FIGS. 8A and 8B are schematic views each showing a quantum cascade laser device 11 according to Example 3. FIG. 8A is a plan view showing the quantum cascade laser device 11 according to Example 3, and FIG. 8B is a cross sectional view taken along the VIIIb-VIIIb line shown in FIG. 8A. The quantum cascade laser device 11 according to Example 3 has a distributed feedback structure. Example 3 has the same structure as in Example 2 except for the metal layer 41. The quantum cascade laser device 11 in Example 3, the second end facet 13*e* comprises a metal layer 41 extending on the core end facet for the core layer 27*a* included in the second end facet 13*e*. The metal layer 41 serves to increase light reflectivity of the cavity mirror of the laser waveguide structure 25 at the second end facet 13*e*. As described above, in order that the metal layer 41 reflects most of the laser light propagating the laser waveguide structure 25 to function as a high reflection film, the width W3 of the third metal layer 41 may be greater than or equal to the first width W1 of the core layer 27*a* in the second end facet 13*e*, and is, for example, 20 micrometers or more. The second portion 19*b* of the wiring metal conductor 19 extends on an area away from the core end facet of the core layer 27*a*, and is not disposed on the core end facet of the core layer 27*a*. The second portion 19*b* is apart from the metal layer 41 so as not to affect the light reflection of the light from the laser waveguide structure 25 at the second end facet 13*e*, and desirably, for example, by a distance of not less than 5 micrometers. In Example 3, the first thickness D1 of the first terrace region 21 is substantially the same as the second thickness D2 of the second terrace region 33. The third region 13*c* in Example 3 comprises a single recess portion 29, which may be a single groove defined by first end facet 13*d* and the second end facet 13*e*. The groove extends from the side 13*h* of the laser structure 13 to the other side 13*i*, and reaches the substrate 23 in depth. The metal layer 41 extends in the recess portion 29 so as to cover the core end facet of the core layer 27*a*.

Example 4

Figure 9:
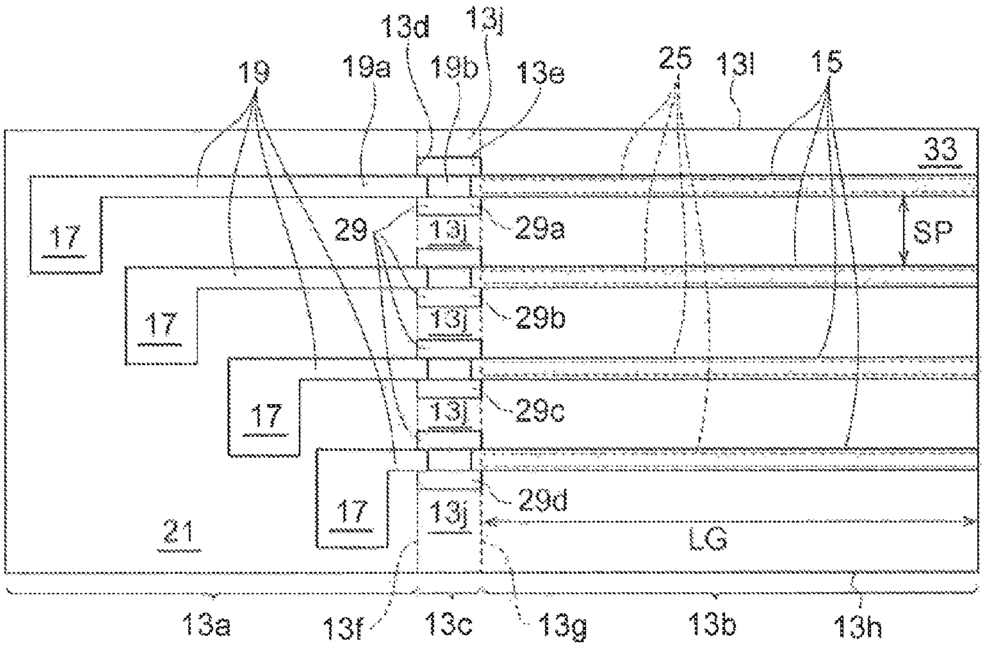
FIG. 9 is a schematic plan view showing a quantum cascade laser device according to Example 4.

FIG. 9 is a schematic plan view showing a quantum cascade laser device 11 according to Example 4. The quantum cascade laser device 11 according to Example 4 has a distributed feedback structure. Example 4 is different from Example 1 in terms of the shape of the recess portion 29, and otherwise is the same as in Example 1. The quantum cascade laser device 11 in Example 4 includes extension regions 13*j* extending in the direction of the first axis Ax1 on the third substrate region 23*c*. The extension regions 13*j* have the same laminated structure as the second terrace region 33. The extension regions 13*j* extend from the second terrace region 33 in the second region 13*b* and reach the first terrace region 21, thereby forming separated openings 29*a*, 29*b*, 29*c* and 29*d*. Each of the openings 29*a*, 29*b*, 29*c*, and 29*d* is formed by etching to reach the substrate 23 in depth like the recess portion 29 as shown in FIG. 2B, thereby forming a recess portion 29. Each of the openings 29*a*, 29*b*, 29*c*, and 29*d* includes the first end facet 13*d* and the second end facet 13*e*. Each of the laser waveguide structure 25 terminates at the second end facet 13*e* in a corresponding one of the openings 29*a*, 29*b*, 29*c*, and 29*d*. In Example 4, the second portion 19*b* of the wiring metal conductor 19 extends on the first end facet 13*d* to connect an end of the second portion 19*b* to the pad electrode 17 through the first portion 19*a*, and the second portion 19*b* extends on the second end facet 13*e* to connect the other end of the second portion 19*b* to an end of the first electrode 15. The second portion 19*b* extends over the end facet of the core layer of the laser waveguide structure 25 like Example 1, and acts as a high-reflective film providing the cavity mirror of the laser waveguide structure 25 with a high reflectivity. Further, in the structure of the present embodiment, the recess portion 29 is formed in the third region 13*c* by etching a narrower area as compared with Example 1, and etching a narrower area may increase the etching rate to shorten the time required for forming the rear end facet of the laser waveguide structure 25 (the second end facet 13*e*). In the structure of the embodiment, the extension regions 13*j* connect the first terrace region 21 and the second terrace region 33 with each other, and the connected structure may improve the mechanical strength of the device in comparison to the structure of Example 1 in which both terrace regions are separated from each other.

Example 5

Figure 10:
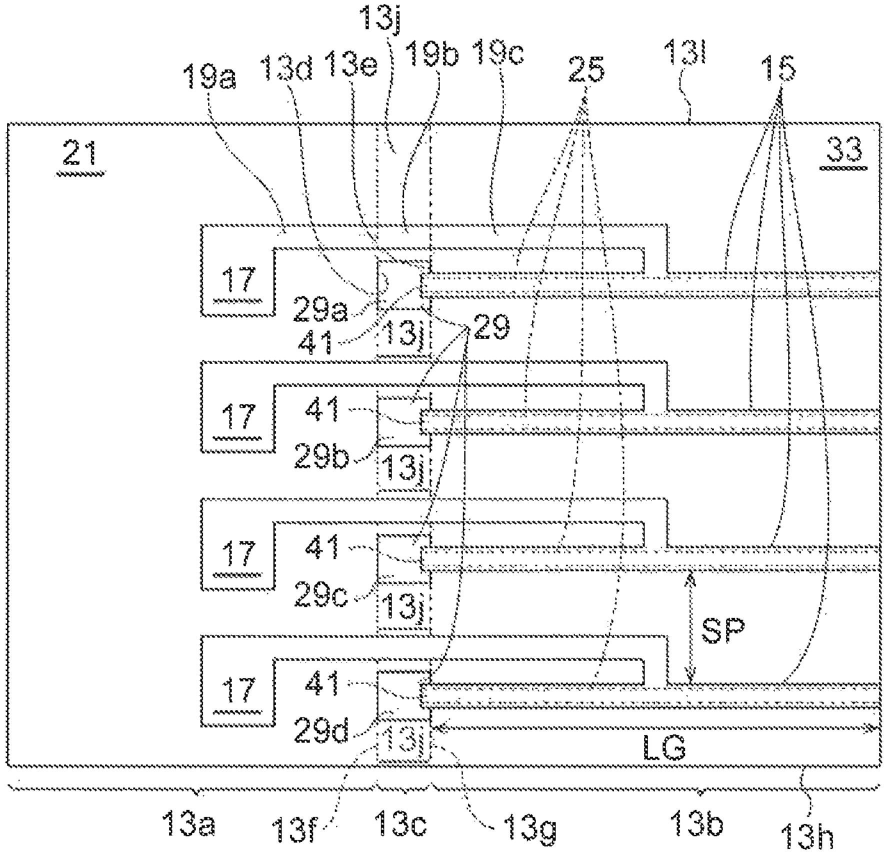
FIG. 10 is a schematic plan view showing a quantum cascade laser device according to Example 5.

FIG. 10 is a schematic plan view showing a quantum cascade laser device 11 according to Example 5. The quantum cascade laser device 11 according to Example 5 has a distributed feedback structure. Example 5 is the same as the structure of Example 4 except for the shape of the wiring metal member 19. In the quantum cascade laser device 11 of Example 5, the recess portion 29 is divided by the extension regions 13*j* to form openings 29*a*, 29*b*, 29*c*, and 29*d* in the same manner as in Example 4. Each of the openings 29*a*, 29*b*, 29*c* and 29*d* of the recess portion 29 is defined by the first end facet 13*d* and the second end facet 13*e*. Each of the laser waveguide structure 25 terminates at the second end facet 13*e* in a corresponding one of the openings 29*a*, 29*b*, 29*c*, and 29*d*. The second portion 19*b* formed on an extension region 13*j* extends onto the first end facet 13*d*, and an end of the second portion 19*b* is connected to the pad electrode 17 through the first portion 19*a*. The second portion 19*b* of the wiring metal conductor 19 extends on the second end facet 13*e* to connect the other end of the second portion 19*b* to an end of the third portion 19*c*. The other end of the third portion 19*c* is connected to an end of the first electrode 15. The second portion 19*b* extends on the second end facet 13*e* so as to be apart from the core end facet of the core layer 27*a* of the laser waveguide structure 25 in the same manner as in Example 3. The metal layer 41 extends on the core end facet of the core layer 27*a* of the laser waveguide structure 25, similarly to the structure in Example 3, and acts as a high-reflective film making the reflectivity of the cavity mirror of the laser waveguide structure 25 higher. The metal layer 41 is optional, and may not be formed on the end facet of the core layer 27*a* included in the second end facet 13*e*.

Example 6

Figure 11:
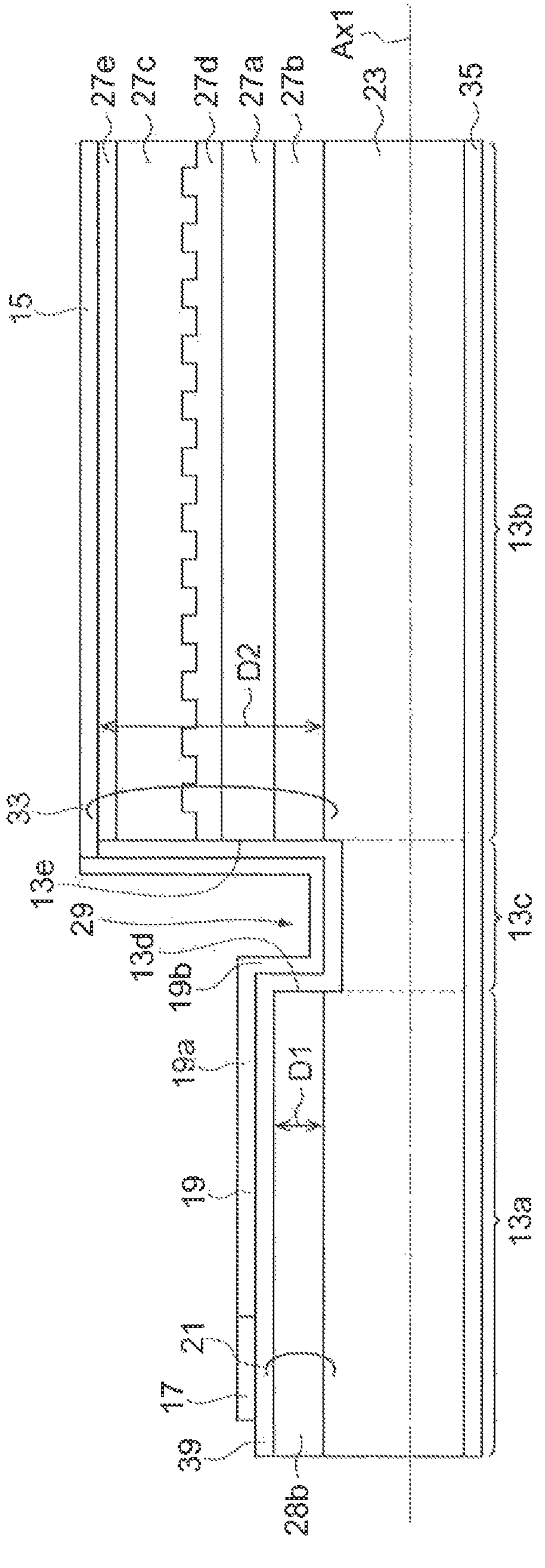
FIG. 11 is a cross sectional view, taken along a line corresponding to the IIb-IIb of FIG. 2A, showing a quantum cascade laser device according to Example 6.

FIG. 11 is a cross sectional view, taken along a line corresponding to IIb-IIb of FIG. 2A, showing a quantum cascade laser device 11 according to Example 6 in a similar manner to FIG. 2B. The quantum cascade laser device 11 according to Example 6 has a distributed feedback structure. In Example 6, the first terrace region 21 has a first thickness D1 greater than zero and less than the second thickness D2 of the second terrace region 33. The first region 13*a* has a first end facet 13*d*, and the second region 13*b* includes a second end facet 13*e*. The first end facet 13*d* and the second end facet 13*e* define a recess portion 29, and the recess portion 29 extends from the side 13*h* of the laser structure 13 to the other side 13*i*, as already described in other embodiments, and reaches the substrate 23 in depth. The wiring metal conductor 19 may extend the recess portion 29 so as to cover the core end facet of the core layer 27*a* on the second end facet 13*e* in the same manner as in Example 1. Alternatively, in the same manner as in Example 2, the wiring metal member 19 may extend within the recess portion 29 so as not to cover the core end facet of the core layer 27*a* on the second end facet 13*e*. If necessary, the metal layer (e.g., a metal layer 41) is provided to cover the core end facet of the core layer 27*a* on the second end facet 13*e* in the same manner as in Example 3. Advantages in the structure of the present embodiment are as follows: degradation in the deposition rate in the recess portion 29 and positional dependency of the deposition rate may be reduced; and this reduction makes the formation of the insulating film 39 and the wiring metal conductor 19 easier as compared to the structure of Example 1.

Example 7

Figure 12A:
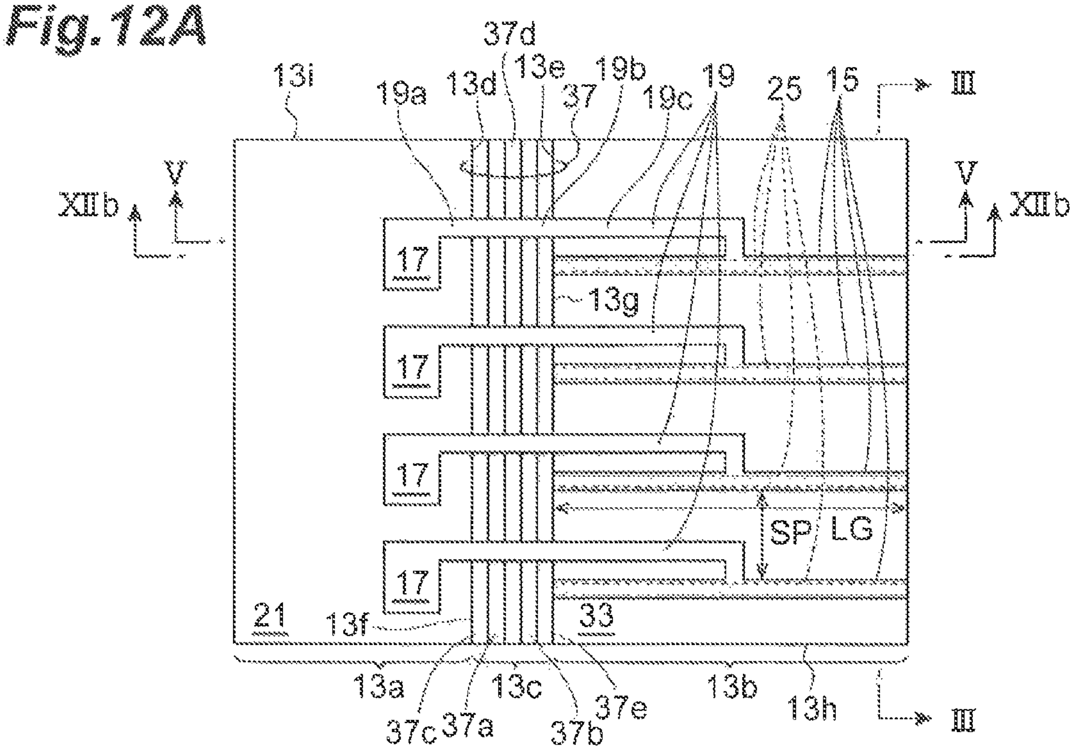
FIGS. 12A and 12B are schematic plan views each showing a quantum cascade laser device according to Example 7.
Figure 12B:
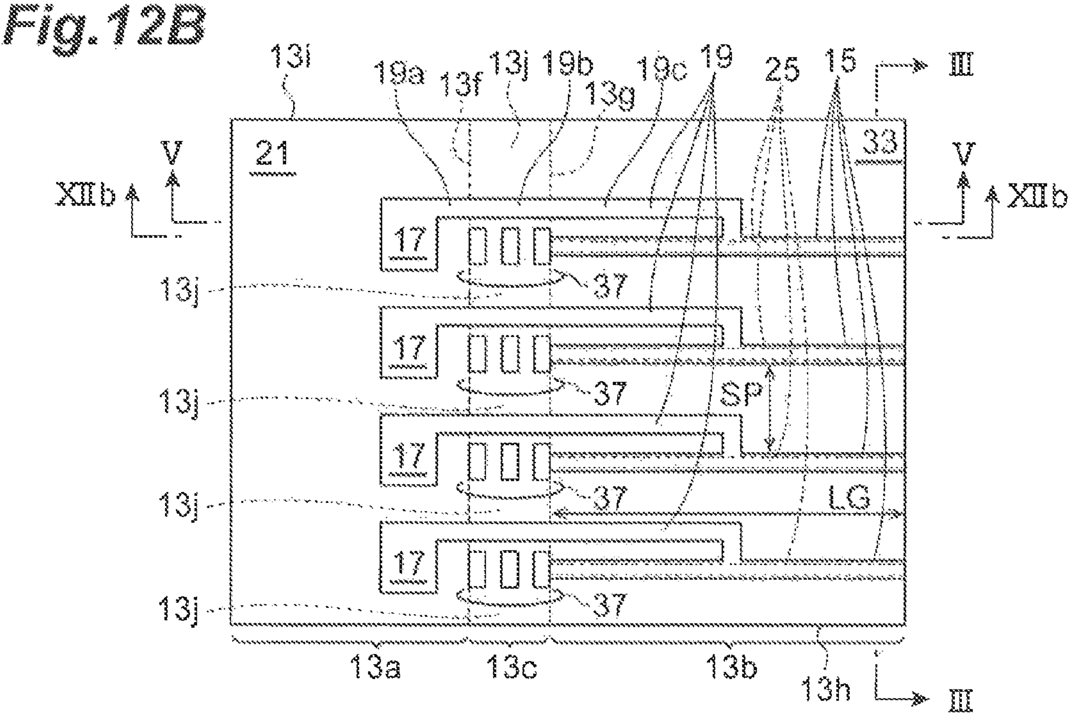
Figure 13:
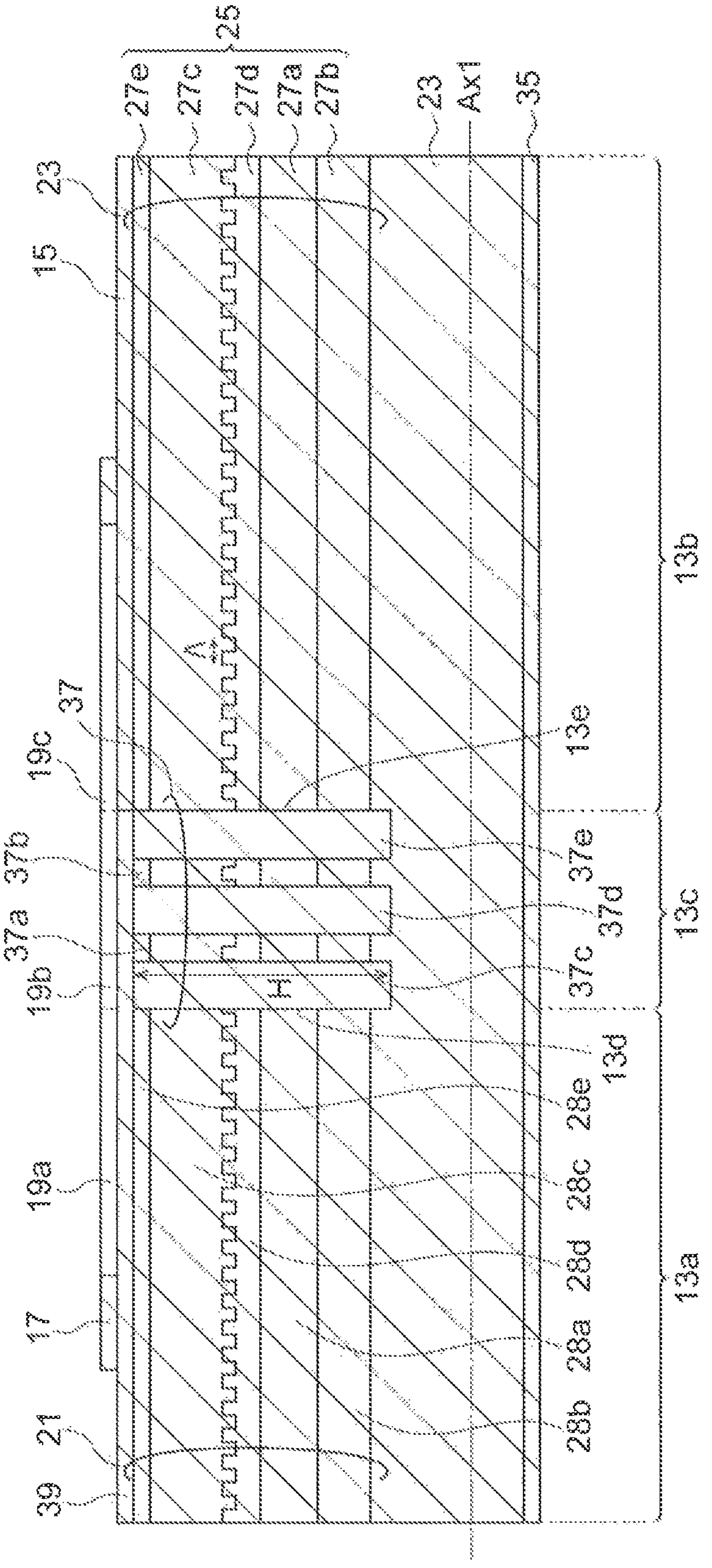
FIG. 13 is a cross sectional view, taken along the XIIb-XIIb line shown in FIG. 12B.

FIGS. 12A and 12B are schematic plan views each showing a quantum cascade laser device 11 according to Example 7. The quantum cascade laser device 11 according to Example 7 has a distributed feedback structure. FIG. 12A schematically shows a quantum cascade laser device 11 comprising a distributed reflector region 37 which is shared by the laser waveguide structures 25. FIG. 12B schematically shows a quantum cascade laser device 11 comprising the laser waveguide structures 25 each of which has an individual distributed reflector regions 37. Example 2 in FIG. 12A is the same as Example 5 in FIG. 12B except for the structure of the third region 13*c* containing the distributed reflector region 37. FIG. 13 is a cross sectional view taken along the XIIb-XIIb line shown in FIGS. 12A and 12B. A distributed reflection region in FIGS. 12A and 12B is disposed in the third region 13*c* between the first boundary 13*f* and the second boundary 13*g*.

As shown in FIG. 13, the distributed reflection region 37 includes high refractive index portions and low refractive index portions which are arranged alternately. Specifically, the distributed reflection region 37 includes the high refractive index portions 37*a* and 37*b* each including a semiconductor wall, and the low refractive index portions 37*c*, 37*d*, and 37*e* each made of material of a lower refractive index than the semiconductor wall. The high refractive index portions 37*a* and 37*b* and the low refractive index portions 37*c*, 37*d*, and 37*e* both may be transparent to light of the oscillation wavelength of the quantum cascade laser device 11. The high refractive index portions 37*a* and 37*b* and the low refractive index portion 37*c*, 37*d* and 37*e* may be arranged alternately in the direction (Ax1 direction) from the first terrace region 21 to the second terrace region 33 to form the distribution in refractive index for distributed reflection. Specifically, the high refractive index portions 37*a* and 37*b* of the semiconductor walls, similar to the second terrace region 33 shown in FIG. 3, are made of a buried hetero structure in which the laser waveguide structures 25 are buried by the semiconductor burying regions 43. Dielectric walls for low refractive index portion 37*c*, 37*d* and 37*e* may be made of a dielectric material, such as BCB resin, polyimide resin, $SiO_2$, SiN, SiON and alumina. The low refractive index portions 37*c*, 37*d* and 37*e* are filled with dielectric material as described above, to reduce a difference in level between the high refractive index portions 37*a* and 37*b* and the low refractive index portions 37*c*, 37*d* and 37*e*, allowing the connection of the first electrode 15 and the pad electrode 17 through the metal conductor 19 that does not pass on a large difference in level. The structure can improve yield in forming the insulating film 39 and the wiring metal conductor 19. As described below, the distributed reflection region 37 is obtained by removing the semiconductor layers (27*a* to 27*e*, and 43) to form the low refractive index portions 37*c*, 37*d*, and 37*e* by etching, and deposit dielectric material therein after the etching. In the formation of the structure of FIG. 12B, the area of semiconductor to be removed by etching for forming low refractive index portions is narrower as compared to FIG. 12A, allowing increase in the etching rate. The structure of FIG. 12B may shorten the time required to form low refractive index portions by etching semiconductor layers in the fabrication. Further, the structure of FIG. 12B in which the first terrace region 21 and the second terrace region 33 are connected by the extension regions 13*j* may further improve the mechanical strength of the device.

Figure 14A:
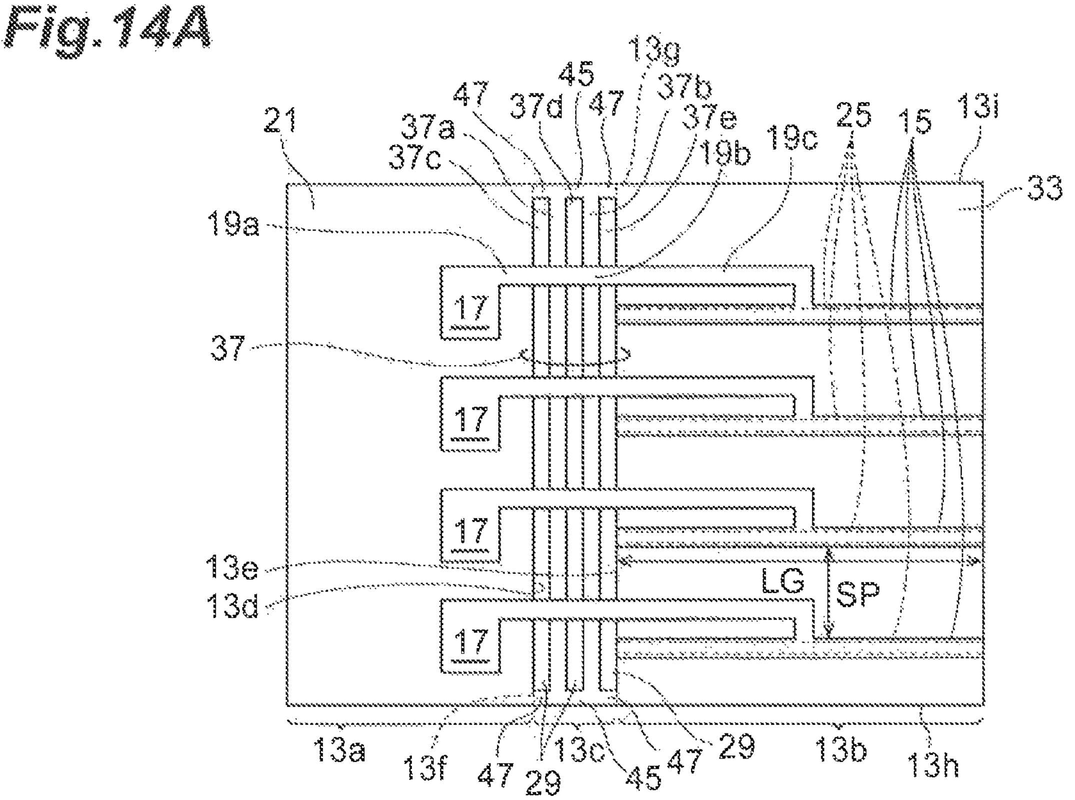
FIGS. 14A and 14B are plan views each showing a quantum cascade laser device in terms of distributed reflector regions according to Examples 8, 9, and 10.
Figure 14B:
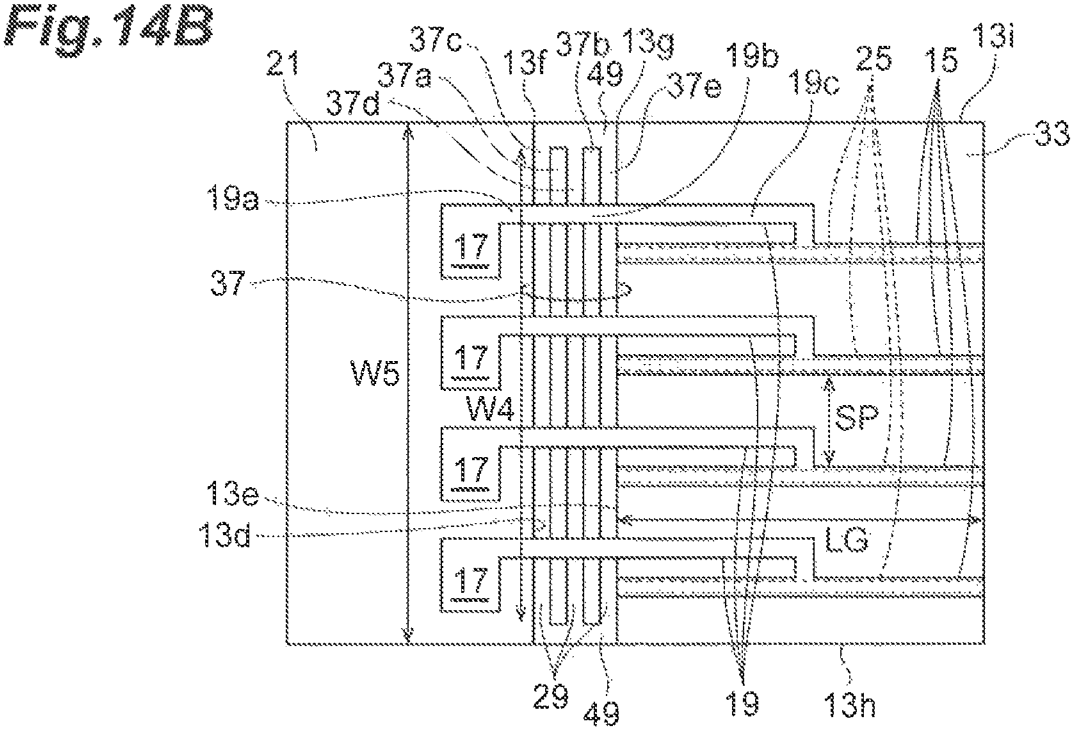

FIGS. 14A and 14B are plan views each showing a distributed reflector region 37 in a quantum cascade laser device 11 according to the embodiments. Device structures shown in these figures are the same as the structure shown in FIG. 12A except for the structure of the distributed reflection region 37.

Example 8

Referring to FIG. 14A, the distributed reflection region 37 may comprise one or more reinforcing walls 45, which connect the high refractive index portions 37*a* and 37*b* from each other. In the present embodiment, the reinforcing walls 45 extend along the side 13*h* and 13*i* of the semiconductor chip containing the quantum cascade laser device 11. The reinforcing walls 45*s* integrate the high refractive index portions 37*a* and 37*b* with each other to enhance the strength of the high refractive index portions. The arrangement of the reinforcement walls 45 is not limited to the reinforcement walls 45 located at the ends of the high refractive index portions 37*a* and 37*b* (along the sides 13*h* and 13*i* of the semiconductor chip), and if needed, the reinforcing walls 45 may be connected to a desired portion of each of the high refractive index portions 37*a* and 37*b*. The reinforcing walls 45 may be made of, for example, the same material as the burying region 43. Incidentally, the reinforcing walls 45 may not connect all of the high refractive index portions, and may connect at least two of the high refractive index portions to form an integrated structure.

Example 9

Referring to FIG. 14A, the distributed reflection region 37 may include connection walls 47, which connect the high refractive index portions 37*a* and 37*b* to the first terrace region 21 and the second terrace region 33. The connection walls 47 integrates a high refractive index portion 37*a* with the first terrace region 21 and/or the high refractive index portion 37*b* with the second terrace region 33 to enhance the strength of the high refractive index portions. In the present embodiment, the connection walls 47 are connected to the respective reinforcing walls 45, and the reinforcing wall 45 may be used, as needed basis. Each connection wall 47 may be an extension provided so as to extend from each of the first terrace region 21 and the second terrace region 33, and the arrangement of the connecting wall 47 is not limited to that located at the semiconductor chip sides 13*h* and 13*i* (the ends of high refractive index portion 37*a* and 37*b*), and if necessary, the connection walls 47 may be disposed at desired positions of the high refractive index portions 37*a* and 37*b*. The connection walls 47 may be made of, for example, the same material as the burying region 43. The present embodiment shows a structure in which the first terrace region 21 and the second terrace region 33 are connected to the high refractive index portions 37*a* and 37*b*, and is not limited thereto, and the present embodiment may have a structure in which the connection walls 47 are connected to any of the high refractive index portions. The present embodiment includes both the connection wall 47 and the reinforcing wall 45, which are independent from each other and one of which may be introduced thereto.

Example 10

Referring to FIG. 14B, the high refractive index portions 37*a* and 37*b* of the distributed reflection region 37 may terminate at respective positions apart from the sides 13*h* and 13*i* of the semiconductor chip in the Ax2 direction intersecting with the direction (the Ax1 direction) in which the laser waveguide structure 25 extends. The high refractive index portions 37*a* and 37*b* each have ends spaced from the sides 13*h* and 13*i* of the semiconductor chip by the connecting walls 49 that connect the low refractive index portions 37*c*, 37*d* and 37*e* to each other. In the structure of the present embodiment, the high refractive index portions 37*a* and 37*b* each have a width W4 in the Ax2 direction, which is shorter than the width W5 of the device, so that the structure in which the ratio (W4/H), defined as a ratio of the width W4 to the height of the high refractive index portions (H in FIG. 13) in the direction normal to the principal surface 23*d* of the substrate 23, is reduced as compared to a structure satisfying W4=W5, in other words, a structure in which the high refractive index portions extend to the respective sides 13*h* and 13*i* of the semiconductor chip. The present embodiment has an advantage in the enhancement of the mechanical strength of the high refractive index portions, which results in that the high refractive index portions becomes less likely to break. Further, in the structure of the present embodiment, the high refractive index portions are not at the sides 13*h* and 13*i*, so that the device separation, such as cleavage, does not damage the high refractive index portions, thereby evading device breakage of the high refractive index portions.

Example 11

Figure 15:
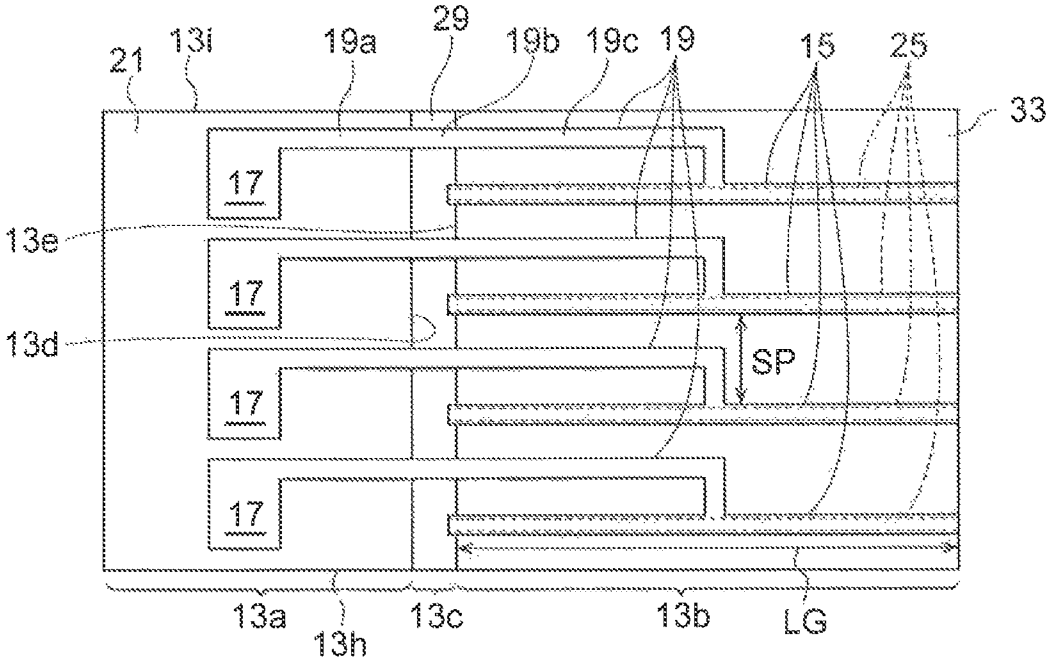
FIG. 15 is a plan view showing a quantum cascade laser device according to Example 11 in terms of the first electrode, the wiring metal conductor and the pad electrode.

FIG. 15 is a plan view showing the structure of the first electrode 15, the wiring metal conductor 19 and the pad electrode 17 of a quantum cascade laser device 11 according to the embodiment. The device structure shown in the figure is the same as that shown in Example 3 except for material of wiring conductors of upper electrodes. In the quantum cascade laser device 11 of Example 11, the material that constitutes at least one of the first electrodes 15, the wiring metal conductors 19 or the pad electrodes 17 are different from that of the other region. This wiring structure may use the material of each of the above regions which is different from materials other regions, thereby increasing design flexibility in the upper wiring electrode structure to make the optimization easy. For example, the first electrodes 15 may be made of Au-based material in terms of excellent ohmic contact with the contact layer 27*e* and Au-plating for heat dissipation, and the pad electrode 17 may be made of Au-based material in terms of bonding by Au-wiring, but the wiring metal conductors 19 may be made of, for example, Cu, to provide improvement in low resistance and cost reduction, as compared with the Au-based structures.

Example 12

Figure 16:
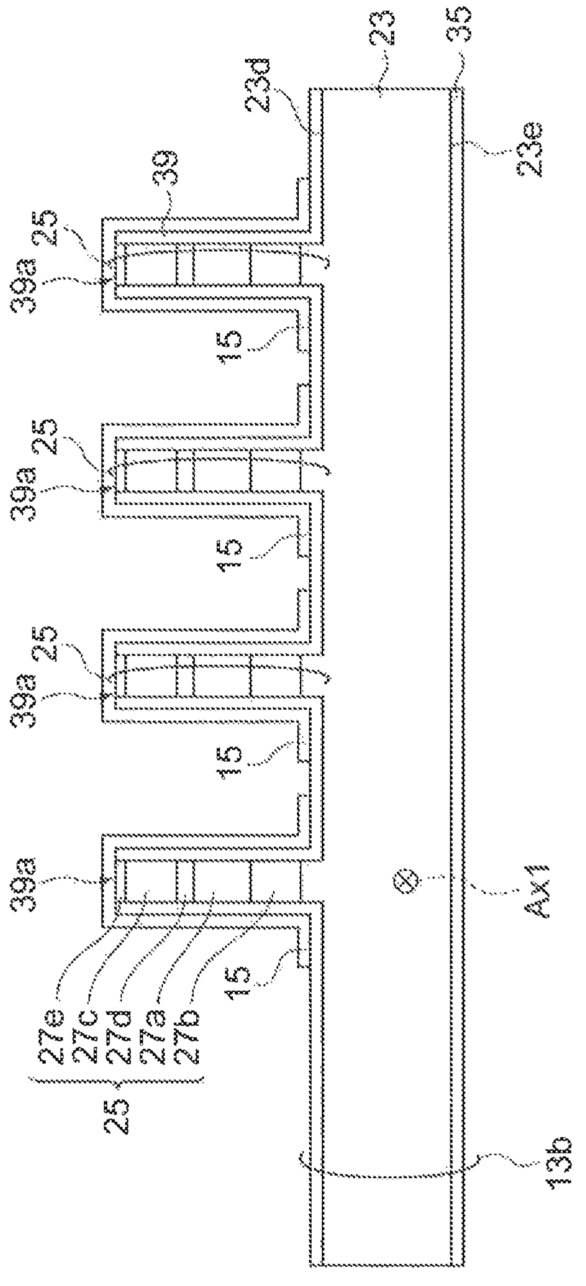
FIG. 16 is a cross sectional view showing a quantum cascade laser device according to Example 12 in terms of the high mesa structure.

FIG. 16 is a cross sectional view showing a quantum cascade laser device 11 of the embodiment according to the high mesa structure. The cross section of FIG. 16 corresponds to that, shown in FIG. 3, which is taken along line III-III in FIG. 2A. In the quantum cascade laser device 11 of each of Examples 1 to 11, the structure of a region which the laser waveguide structures 25 are formed is not limited to the buried heterostructure shown in FIG. 3, and may be any other structure. For example, the embodiment may have a high-mesa structure in which the insulating film 39 covers the mesa sides of each laser waveguide structure 25, as shown in FIG. 16, without embedding the mesa-shaped laser waveguide structure 25. The insulating film 39 has an opening 39*a* located on the top of the laser waveguide structure 25, and the first electrode 15 forms a contact with the top of the laser waveguide structure 25 through the opening 39*a*. The first electrode 15 is provided on both sides of the laser waveguide structure 25, and is also located on the principal surface 23*d* of the substrate 23. The first electrode 15 extends in the direction of the first axis Ax1. In the present waveguide structure, the mesa sides of the laser waveguide structure 25 are covered with an insulating film 39 of a lower refractive index than semiconductor, thereby making light confinement to the core layer 27*a* larger as compared with a buried heterostructure embedding mesa sides with a semiconductor layer 43, thereby obtaining an advantage that improvement in lasing characteristics is expected. Further, the present embodiment structure can simplify the manufacturing process because fabricating a quantum cascade laser device 11 of the distributed feedback may use two crystal growth steps.

In the described device structure of Examples 1 to 12 above, the pad electrodes 17 are separated from the second region 13*b*, which contains the laser waveguide structures 25, to allow the pad electrodes 17 to be aggregated into the first region 13*a*, so that in the waveguide structures 25, the spacing SP between the adjacent laser waveguide structures 25 and the cavity length LG of the individual laser waveguide structure 25 are independently of the arrangement and the size of the pad electrodes 17. The arrangement of the pad electrodes 17 is independent of the cavity length LG and the spacing SP and the arrangement of the first electrode. The above embodiments may provide a quantum cascade laser device having a structure in which the arrangement and size of the pad electrodes for the respective laser waveguide structures may relax structural constraints imposed on the arrangement and size of the laser waveguide structures.

An exemplary manufacturing method, for example, a method for fabricating a quantum cascade laser device 11 with a distributed reflector region 37 in Example 7, will be described below. If possible, the reference numerals denoted in the above embodiments will be used in the following description for ease of understanding. The substrate 23, such as an n-type InP wafer, is prepared. The following semiconductor layers are grown on the InP wafer: n-type InP layer for the lower cladding layer 27*b*, the superlattice structure for the core layer 27*a* (the quantum well layer: GaInAs, a barrier layer: AlInAs), undoped or n-type GaInAs layer for the diffraction grating layer 27*d*. Thereafter, the diffraction grating layer 27*d* is processed using photolithography and etching, as shown in FIG. 13, to form a diffraction grating, which has projections and recesses alternately arranged at a period Λ in the Ax1 direction. Here, in order to obtain the laser waveguide structures 25 which emit lasing beams of different wavelengths, it is necessary to form the diffraction grating layer 27*d* having a different period Λ, corresponding to a lasing wavelength, for each laser waveguide structure 25. After the formation, an n-type InP layer for the upper cladding layer 27*c* and an n-type GaInAs layer for the contact layer 27*e* are grown in this order to complete a semiconductor laminate. The above growth steps may be performed by, for example, metal-organic chemical vapor deposition or molecular beam epitaxy. The contact layer 27*e* is optional, and is not needed if a desired ohmic contact between the first electrode 15 and the underlying semiconductor layer may be obtained without the contact layer. If necessary, optical confinement layers may be disposed above and below the core layer 27*a* in order to enhance the confinement of light into the core layer 27*a*. The optical confinement layers are required to have a higher refractive index than that of the core layer 27*a* in order to enhance the confinement of light to the core layer 27*a*, and may be made of undoped or n-type GaInAs. On the semiconductor laminate, a first insulating film mask having stripe patterns for the respective laser waveguide structures 25 is formed. Dry etching using the first insulating film mask forms semiconductor mesas for the laser waveguide structures 25. With the first insulating film mask being left, the semiconductor mesas are embedded with a semiconductor region of InP (GaInAs, AlInAs, GaInAsP, or AlGaInAs) which is undoped material or semi-insulating material containing a transition metal, such as Co, Fe, Ti, and Cr. Removing the first insulating film mask is carried out after this embedding growth. On the semiconductor region, a second insulating film mask is formed. The second insulating film mask has a pattern defining the first terrace region 21, the second terrace region 33, and the distributed reflector region 37. Dry etching using the second insulating film mask may produce the first end facet 13*d*, the second end facet 13*e*, the first terrace region 21, the second terrace region 33, and the high refractive index portion(s) of the distributed reflection region form the semiconductor region. After the process, dielectric material for low refractive index portions 37*c*, 37*d* and 37*e* of the distribution reflection region 37 are deposited, and the refractive index distribution is formed in the distribution reflection region 37 by etching. The low refractive index portions may be made of dielectric material, such as $SiO_2$, SiN, SiON, alumina, polyimide resin or BCB resin, and these materials may be made by a film forming method, such as sputtering spin coating. Then, $SiO_2$ (or such as dielectric layer, SiN, SiON, alumina, polyimide resin, or BCB resin) is grown over the entire surface of the wafer to form the insulating film 39, and an opening 39*a* for electrical contact is formed on each laser waveguide structure 25. Thereafter, the patterning and deposition of metal for the first electrode 15, the pad electrode 17, wiring metal conductor 19 are carried out on the entire wafer surface. Further, metal deposition for the second electrode 35 may be performed on the back surface of the InP wafer. The second electrode 35, the first electrode 15, the pad electrode 17, the wiring metal conductor 19 and the metal layer 41 may be made of gold-based material, such as Ge/Au or Ti/Au. These steps complete a substrate product including an array of the quantum cascade lasers devices 11 each comprising an array of the laser waveguide structures 25. Incidentally, a quantum cascade laser device 11 according to another embodiment may also be formed in the same manner as described above technique.

The technical background of the mid-infrared quantum cascade semiconductor laser will be described below. The mid-infrared quantum cascade semiconductor laser is a promising light source of low cost and small size applicable to industrial fields in mid-infrared wavelengths, such as, environmental gas analysis, medical diagnosis, which significant growth is expected, and is actively developed. For example, gas sensing applications, such as environmental gas analysis, require the laser to operate in a single mode at a wavelength corresponding to a specific absorption line of the target gas, and the diffraction grating (diffraction grating layer 27*d*) is effective in wavelength selection. A single infrared quantum cascade semiconductor laser basically has a certain lasing wavelength determined by the period of the diffraction grating as described above. Varying the injection current and/or device temperature allows the tuning of wavelength in a very narrow wavelength range, but cannot provide wider variation in wavelength. This shows that the single infrared quantum cascade semiconductor laser may measure a gas component having absorption at the oscillation wavelength that is determined by the grating period. However, what is needed in actual analysis is to analyze a plurality of gas components of different absorption wavelengths over a wide wavelength range together.

A monolithically-integrated infrared quantum cascade semiconductor light source with different lasing wavelengths on a single semiconductor substrate allows simultaneous analysis of a plurality of gas components. Here, shortening the cavity length of the laser waveguides in the array contributes to low power consumption, and reducing the laser waveguide spacing contributes to reduction in device size. These contributions enable a mid-infrared quantum cascade semiconductor laser array, for example, in gas sensing applications. In such an array, the number of pad electrodes increases with the number of laser waveguide structure. Inventors' teachings reveal that the placement of a large number of pad electrodes constrains the arrangement and size of the laser waveguide structures. Specifically, in a simple array of the infrared quantum cascade semiconductor lasers, the laser waveguide structures and the pad electrodes are located in the same region, and using wire-bonding requires the cavity length of the laser waveguide structures and the interval between the laser waveguide structures to have an area of 100×100 micrometers or more per laser, and therefore, the simple array makes both the reduction in the cavity length and the interval difficult. But, the quantum cascade laser device 11 according to the present embodiments may has the cavity length of the laser waveguide structures independent of the placement and size of the pad electrodes, and makes it easy to shorten the cavity length t, leading to low-power operation. Also determining the distance between the laser waveguide structures independent of the placement and size of the pad electrodes makes it easy to reduce the above interval, which contributes to reduction in chip size. These reductions can contribute to enabling the practical use in gas sensing applications.

Incidentally, the quantum cascade laser device 11 according to the present invention is not limited to those described in the above embodiment. For example, the diffraction grating layer 27*d* is prepared for each laser waveguide structure 25 in the above embodiment, which is not limited thereto, and the laser waveguide structure 25 may not include the diffraction grating layer 27*d*. For example, the laser waveguide structure 25 that does not include a diffraction grating layer 27*d* forms a so-called Fabry-Perot (Fabry-Perot type) quantum cascade laser device 11.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:

1. A quantum cascade laser comprising:

a substrate including a first substrate region, a second substrate region, and a third substrate region that are arranged in a direction of a first axis, the third substrate region being disposed between the first substrate region and the second substrate region;

a laser structure having a laser cavity and being disposed on the substrate, the laser structure including a plurality of laser waveguide structures each extending in the direction of the first axis, and a first terrace region disposed on the first substrate region, the laser structure including a first region, a second region and a third region that include the first substrate region, the second substrate region, and the third substrate region of the substrate, respectively, the first region having a first end facet disposed at a boundary between the first region and the third region, the first end facet extending in a direction intersecting with the first axis, the second region having a second end facet disposed at a boundary between the second region and the third region, the second end facet extending in a direction intersecting with the first axis, the second region including the laser waveguide structures;

a plurality of first electrodes disposed on the laser waveguide structures, each of the laser waveguide structures having a core layer extending in the direction of the first axis, each core layer terminating at the second end facet and having a core end facet that is included in the second end facet;

a plurality of wiring metal conductors, each of the wiring metal conductors having a part that is disposed on the core end facet of one of the core layers and that constitutes a reflection mirror of the laser cavity; and a plurality of pad electrodes disposed on the first terrace region, each of the pad electrodes being connected to one of the first electrodes through one of the wiring metal conductors.

2. The quantum cascade laser according to claim 1, wherein the laser structure further includes a second terrace region disposed on the second substrate region, the second terrace region includes the second end facet and the laser waveguide structures, and the first electrodes are disposed on the second terrace region.

3. The quantum cascade laser according to claim 1, wherein each of the wiring metal conductors includes a first portion disposed on the first terrace region, a second portion disposed on the third region, and a third portion disposed on the second region.

4. The quantum cascade laser according to claim 1, wherein the third region includes an extension region extending from the first terrace region to the third substrate region in the direction of the first axis.

5. The quantum cascade laser according to claim 1, wherein the first end facet and the second end facet extend from a side of the quantum cascade laser to another side of the quantum cascade laser.

6. A quantum cascade laser comprising:

a substrate including a first substrate region, a second substrate region, and a third substrate region that are arranged in a direction of a first axis, the third substrate re ion being disposed between the first substrate region and the second substrate region;

a laser structure having a laser cavity and being disposed on the substrate, the laser structure including a plurality of laser waveguide structures each extending in the direction of the first axis, and a first terrace region disposed on the first substrate region, the laser structure including a first region, a second region and a third region that include the first substrate region, the second substrate region, and the third substrate region of the substrate, respectively, the first region having a first end facet disposed at a boundary between the first region and the third region, the first end facet extending in a direction intersecting with the first axis, the second region having a second end facet disposed at a boundary between the second region and the third region, the second end facet extending in a direction intersecting with the first axis, the second region including the laser waveguide structures;

a plurality of first electrodes disposed on the laser waveguide structures, each of the laser waveguide structures having a core layer extending in the direction of the first axis, each core layer terminating at the second end facet;

a plurality of wiring metal conductors; and a plurality of pad electrodes disposed on the first terrace region, each of the pad electrodes being connected to one of the first electrodes through one of the wiring metal conductors, wherein the core layer has a core end facet that is included in the second end facet disposed at the boundary between the second region and the third region, the quantum cascade laser further includes a metal layer disposed on the core end facet of the core layer and constituting a reflection mirror of the laser cavity, and the metal layer is apart from each of the wiring metal conductors on the second end facet.

7. A quantum cascade laser comprising:

a substrate including a first substrate region, a second substrate region, and a third substrate region that are arranged in a direction of a first axis, the third substrate region being disposed between the first substrate region and the second substrate region;

a laser structure having a laser cavity and being disposed on the substrate, the laser structure including a plurality of laser waveguide structures each extending in the direction of the first axis, and a first terrace region disposed on the first substrate region, the laser structure including a first region, a second region and a third region that include the first substrate region, the second substrate region, and the third substrate region of the substrate, respectively, the first region having a first end facet disposed at a boundary between the first region and the third region, the first end facet extending in a direction intersecting with the first axis, the second region having a second end facet disposed at a boundary between the second region and the third region, the second end facet extending in a direction intersecting with the first axis, the second region including the laser waveguide structures;

a plurality of first electrodes disposed on the laser waveguide structures, each of the laser waveguide structures having a core layer extending in the direction of the first axis, each core layer terminating at the second end facet;

a plurality of wiring metal conductors; and a plurality of pad electrodes disposed on the first terrace region, each of the pad electrodes being connected to one of the first electrodes through one of the wiring metal conductors, wherein the laser structure includes a distributed Bragg reflecting region disposed on the third substrate region, the second end facet is optically coupled to the distributed Bragg reflecting region, the distributed Bragg reflecting region includes one or more high reflective walls extending in a direction normal to a principal surface of the substrate, the high reflective walls are apart from the first end facet and the second end facet, and the high reflective walls are disposed between the first end facet and the second end facet.

8. The quantum cascade laser according to claim 1, wherein the quantum cascade laser further includes an insulating film disposed between the wiring metal conductor and the core end facet of the core layer included in the second end facet.

* * * * *